United States Patent [19]
Lee et al.

[11] Patent Number: 6,086,679
[45] Date of Patent: Jul. 11, 2000

[54] DEPOSITION SYSTEMS AND PROCESSES FOR TRANSPORT POLYMERIZATION AND CHEMICAL VAPOR DEPOSITION

[75] Inventors: Chung J. Lee; Hui Wang, both of Fremont; Giovanni Antonio Foggiato, Morgan Hill, all of Calif.

[73] Assignee: Quester Technology, Inc., Fremont, Calif.

[21] Appl. No.: 08/958,352

[22] Filed: Oct. 24, 1997

[51] Int. Cl.[7] .................................................. C23C 16/00
[52] U.S. Cl. ........................ 118/724; 118/715; 118/726; 118/723 MR; 118/723 ER
[58] Field of Search ................... 118/715, 724, 118/726, 723 MR, 723 ER

[56] References Cited

U.S. PATENT DOCUMENTS

| | | | |
|---|---|---|---|
| 3,268,599 | 8/1966 | Chow et al. | 268/649 |
| 3,274,267 | 9/1966 | Chow | 260/649 |
| 3,342,754 | 9/1967 | Gorham | 260/2 |
| 3,440,277 | 4/1969 | Holland et al. . | |
| 4,291,244 | 9/1981 | Beach et al. . | |
| 4,522,674 | 6/1985 | Ninomiya | 118/724 |
| 4,532,369 | 7/1985 | Hartner | 585/428 |
| 4,772,486 | 9/1988 | Ishihara et al. | 427/39 |
| 5,139,813 | 8/1992 | Yira et al. . | |
| 5,178,904 | 1/1993 | Ishihara | 427/585 |
| 5,210,341 | 5/1993 | Dolbier, Jr. et al. . | |
| 5,268,202 | 12/1993 | You et al. | 427/255.6 |
| 5,324,813 | 6/1994 | Hougham et al. . | |
| 5,334,454 | 8/1994 | Caporiccio et al. . | |
| 5,424,097 | 6/1995 | Olson et al. . | |
| 5,534,068 | 7/1996 | Beach et al. . | |
| 5,536,317 | 7/1996 | Crain et al. . | |
| 5,536,319 | 7/1996 | Wary et al. . | |
| 5,536,321 | 7/1996 | Olsen et al. . | |
| 5,536,322 | 7/1996 | Wary et al. . | |
| 5,536,892 | 7/1996 | Dolbier, Jr. et al. . | |
| 5,538,758 | 7/1996 | Beach et al. . | |
| 5,556,473 | 9/1996 | Olson et al. . | |
| 5,637,395 | 6/1997 | Uemura et al. . | |
| 5,783,614 | 7/1998 | Chen et al. . | |
| 5,958,510 | 9/1999 | Sivaramakrishnam | 427/255.6 |

FOREIGN PATENT DOCUMENTS

| | | |
|---|---|---|
| 0 769 788 A2 | 4/1997 | European Pat. Off. . |
| 59-82720 | 5/1984 | Japan . |
| 60-231442 | 11/1985 | Japan . |
| WO 97/14666 | 4/1997 | WIPO . |
| WO 97/15699 | 5/1997 | WIPO . |
| WO 97/15951 | 5/1997 | WIPO . |
| WO 98/24743 | 6/1998 | WIPO . |
| WO 98/41490 | 9/1998 | WIPO . |

OTHER PUBLICATIONS

Jozef Bicerano, Prediction of Polymer Properties, Second Edition, Marcel Dekker, Inc., pp. 1–15, 50–61, 108–111, and 280–295.

Kogelschatz, Excitation of Excimer Radiation in Silent Discharges, IEEE, 218–227, 1987.

J.I. Krochiwitz, Encyclopedia of Chem. Tech., vol. 5, 320–373, 1991.

(List continued on next page.)

*Primary Examiner*—Richard Bueker
*Attorney, Agent, or Firm*—Fliesler, Dubb, Meyer, & Lovejoy LLP

[57] ABSTRACT

The described deposition systems are designed to accommodate new precursors and chemical processes used for transport polymerization and chemical vapor deposition. The systems consist primarily of a reactor, a liquid injector or gas mass flow controller, a cracker and a deposition chamber under sub-atmospheres pressure. The cracker utilizes one or more types of energy, including heat, photons, and plasmas. This invention is especially useful for preparing F-PPX (fluorinated poly(para-xylylenes) and other fluorinated polymer thin films for intermetal dielectric (IMD) and interlevel dielectric (ILD) applications in the manufacture of integrated circuits with features <0.25 $\mu$m in size.

76 Claims, 14 Drawing Sheets

OTHER PUBLICATIONS

Labelle, et al., Characterization of Pulsed–Plasma Enhanced Chemical Vapor Deposited Fluorocarbon Thin Films, Feb. 10–11, 1997, DUMIC Conference, 1997 ISMIC—222D/97/0034, 98–105.

Lee, Transport Polymerization of Gaseous Intermediates and Polymer Crystals Growth, J. Macromol. Sci.—Rev. Macromol. Chem., C16(1), 79–127, 1977–1978.

J.J. McKetta, Encyclopedia of Chem. Proc. & Design, vol. 14, 276–291, 1992.

Meriaudeau, et al., Dehydrocyclization of Alkanes Over Zeolite–Supported Metal Catalysts: Monofunctional or Bifunctional Route, Catal. Rev. Sci. Eng., 39(1&2), 5–48, 1997.

Robles, et al., Characterization of High Density Plasma Chemical Vapor Deposited α–Fluorinated Carbon Films for Ultra Low Dielectric Applications, Feb. 10–11, 1997, DUMIC Conference, 1997 ISMIC—222D/97/0026, 26–33.

Selbrede, et al., Characterization of Parylene–N Thin Films for Low Dielectric Constant VLSI Applications, Feb. 10–11, 1997, DUMIC Conference, 1997 ISMIC—222D/97/0034, 121–124.

Sharangpani, et al., Advantages of Chemical Vapor Deposition Over Conventional Techniques for the Processing of Amorphous Teflon Fluoropolymer, Feb. 10–11, 1997, DUMIC Conference, 1997 ISMIC—222D/97/0034, 117–120.

Shimogaki, et al., How Long F–Doped $SiO_2$ Films Can Be Obtained, Feb. 10–11, 1997, DUMIC Conference, 1997 ISMIC—222D/97/0034, 189–191.

Sugahara, et al., Low Dielectric Constant Carbon Containing $SiO_2$ Films Deposited by PECVD Technique Using a Novel CVD Precursor, Feb. 10–11, 1997, DUMIC Conference, 1997 ISMIC—222D/97/0034, 19–25.

Wang et al., Parylene–N Thermal Stability Increase by Oxygen Reduction–Low Substrate Temperature Deposition, Preannealing, and PETEOS Encapsulation, Feb. 10–11, 1997, DUMIC Conference, 1997 ISMIC—222D/97/0034, 125–128.

Wary, et al., Vacuum–Deposited Parylene AF–4: A Thermally Stable, Low Dielectric Constant Polymer for Interlayer Dielectric Use, Semi–Conductor International, 211–216, Jun. 1996.

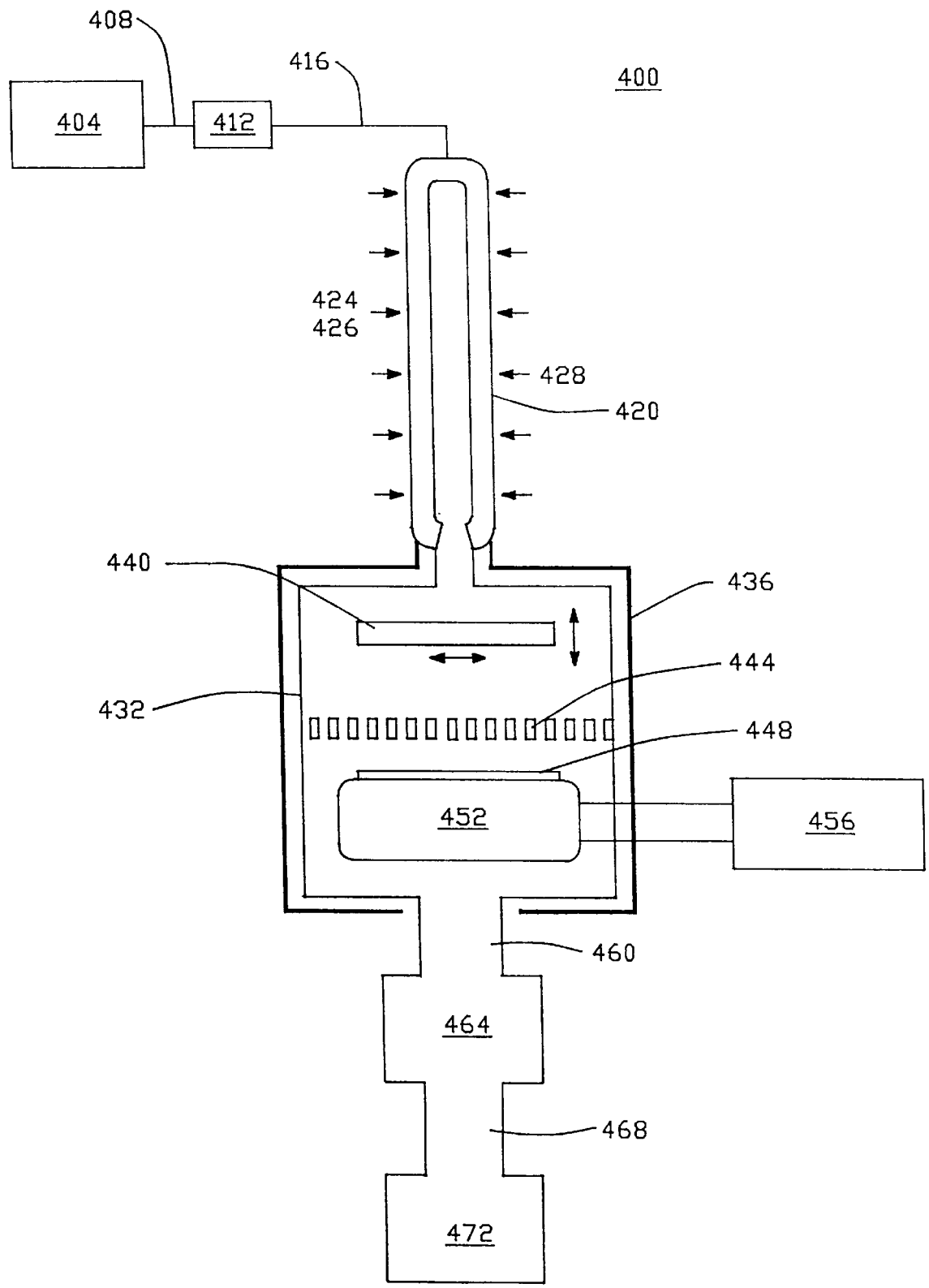
FIG.—4

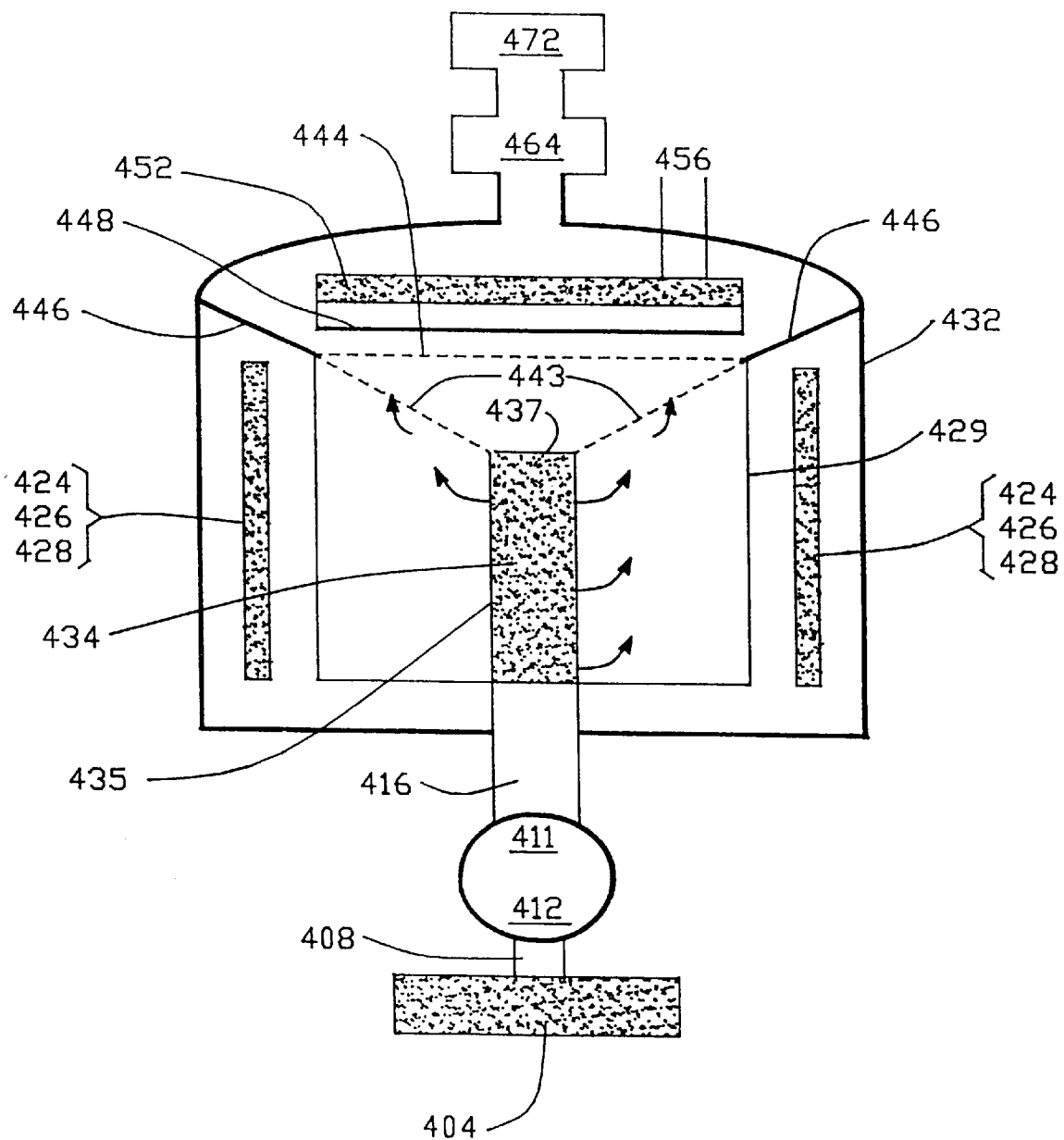
FIG.—4b

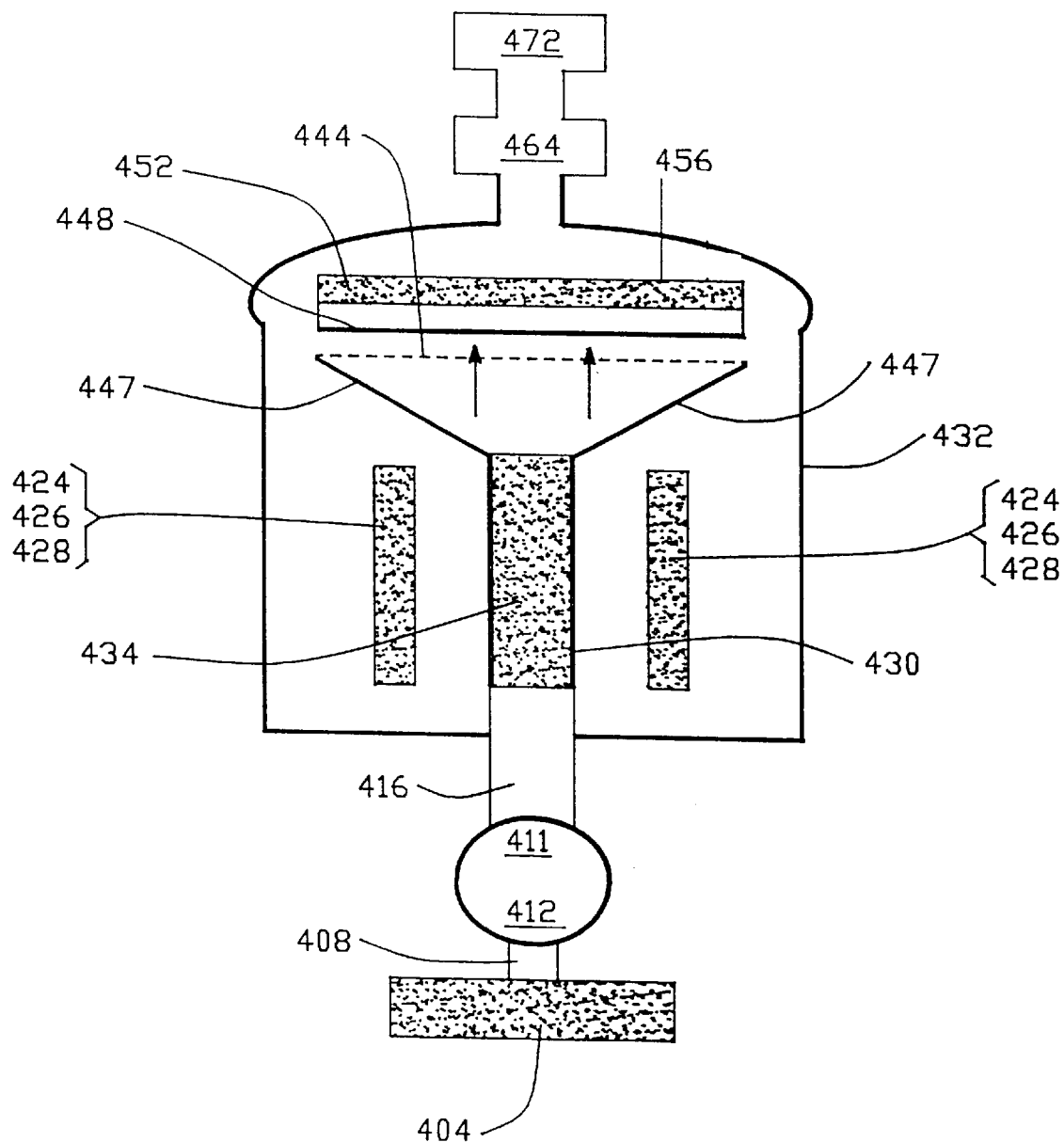
FIG.—4c

FIG.—6

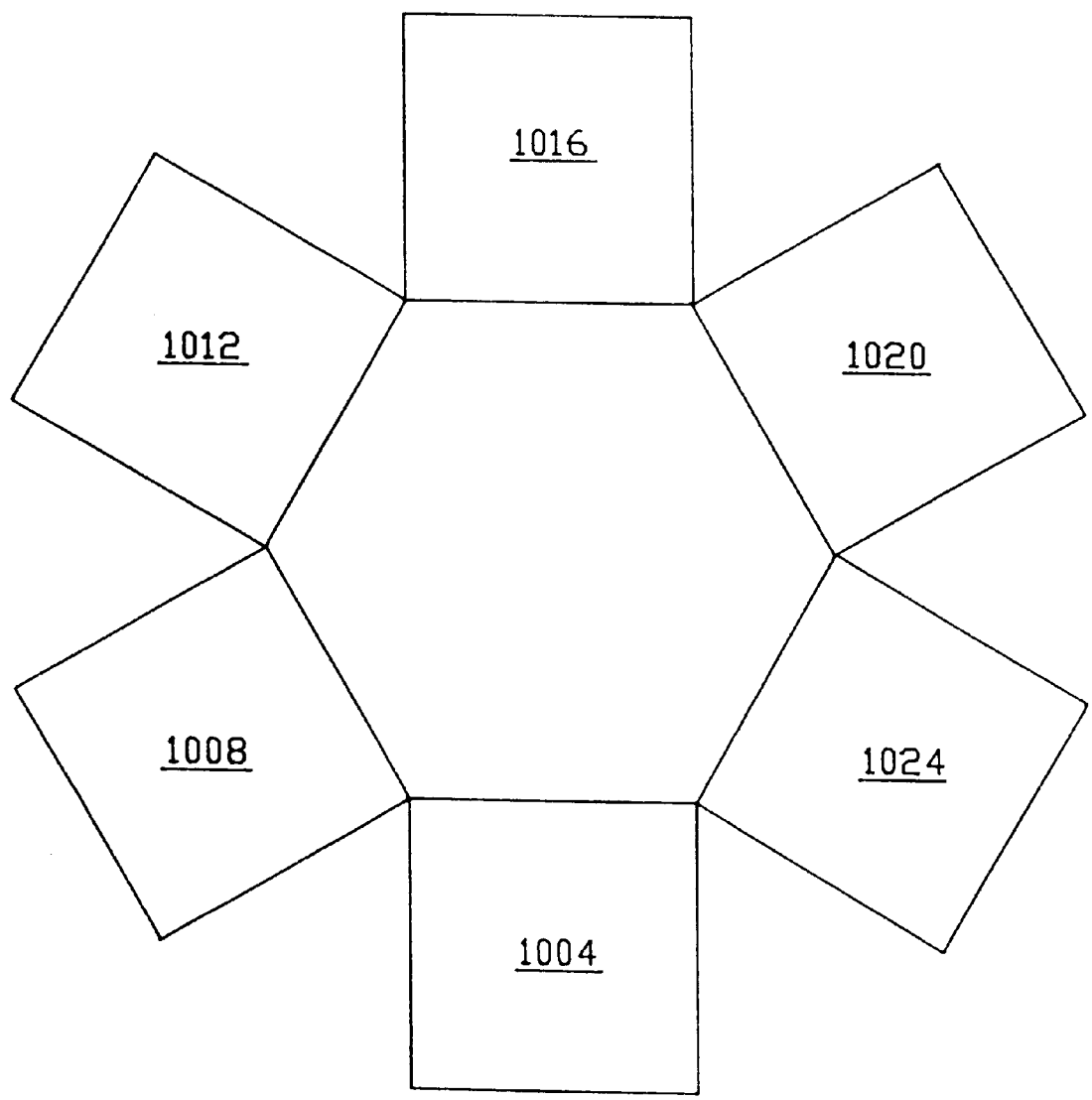
FIG.—10

DEPOSITION SYSTEMS AND PROCESSES FOR TRANSPORT POLYMERIZATION AND CHEMICAL VAPOR DEPOSITION

CROSS REFERENCE

Ser. No. 08/957,481 Lee et al., Precursors for Making Low Dielectric Constant Materials with Improved Thermal Stability. Attorney Docket No.: QTII 8020 SRM/DBB.

Ser. No. 08/957,792 Lee et al. Chemicals and Processes for Making Fluorinated Poly(Para-Xylylenes). Attorney Docket No.: QTII 8021 SRM/DBB.

Ser. No. 08/958,057 Lee et al., Low Dielectric Constant Materials with Improved Thermal and Mechanical Properties. Attorney Docket No.: QTII 8023 SRM/DBB.

Ser. No. 08/957,480 Lee et al., Low Dielectric Constant Materials Prepared from Photon or Plasma Assisted Chemical Vapor Deposition and Transport Polymerization of Selected Compounds. Attorney Docket No.: QTII 8024 SRM/DBB.

All of the above co-pending applications are herein incorporated fully by reference.

FIELD OF THE INVENTION

This invention describes new deposition systems and their variations for preparing polymer thin films. The systems and processes provide products which have a low dielectric constant, K, and which have good thermal stability. The low K dielectric thin films are useful as intermetal dielectric and interlevel dielectric materials for integrated circuit fabrication.

BACKGROUND OF THE INVENTION

For the past 20 years, the integrated circuit (IC) device density has doubled about every 18 months. When the gate length of integrated circuits is less than 0.18 $\mu$m, the propagation time or delay time is dominated by interconnect delay instead of device gate delay. To address this problem, new materials with low dielectric constants are being developed. The aim of this development is to decrease time constant (RC delay), decrease power consumption, and decrease cross-talk in integrated circuits. There are two groups of low K dielectric materials. These include the traditional inorganic group exemplified by $SiO_2$, and newer organic polymers, exemplified by poly(para-xylylene). Organic polymers are considered an improvement over inorganic low dielectric materials because the K of organic polymers can be as low as 2.0. However, most of the currently available organic polymers have serious problems. Specifically, they have insufficient thermal stability, and are difficult and expensive to manufacture in a vacuum system.

For IC features of 0.35 $\mu$m, current production lines use materials consisting primarily of $SiO_2$. The $SiO_2$ products have dielectric constants ranging from 4.0 to 4.5. In addition, stable fluorinated $SiO_2$ materials with a dielectric constant of 3.5 have been achieved. These $SiO_2$-containing materials are primarily obtained from plasma enhanced chemical vapor deposition (PECVD), photon assisted chemical vapor deposition (PACVD), and high density plasma chemical vapor deposition (HDPCVD) of various silanes, siloxanes and hydrocarbons.

I. Precursors and Polymers

During the past few years, several types of precursors have been used to manufacture polymers with low dielectric constants for use in manufacture of integrated circuits (IC). Transport Polymerization (TP) and Chemical Vapor Deposition (CVD) methods have been used to deposit such low dielectric materials. The starting materials, precursors and end products fall into three groups, based on their chemical compositions. The following examples of these types of precursors and products are taken from Proceedings of the *Third International Dielectrics for Ultra Large Scale Integration Multilevel Interconnect Conference (DUMIC)*, Feb. 10–11 (1997).

A. Modification of $SiO_2$ by Carbon (C) and Fluorine (F)

The first method described is the modification of $SiO_2$ by adding carbon and/or fluorine atoms. McClatchie et al., *Proc. 3d Int. DUMIC Conference,* 34–40 (1997) used methyl silane ($CH_3$—$SiH_3$) as a carbon source, and when reacted with $SiH_4$ and the oxidant $H_2O_2$ and deposited using a thermal CVD process, the dielectric constant (K) of the resulting polymer was 3.0. However, this K is too high to be suitable for the efficient miniaturization of integrated circuits.

Sugahara et al., *Proc. 3d Int. DUMIC Conference,* 19–25 (1997) deposited the aromatic precursor, $C_6H_5$—Si—$(OCH_3)_3$ on $SiO_2$ using a plasma enhanced (PE) CVD process that produced a thin film with a dielectric constant K of 3.1. The resulting polymer had only fair thermal stability (0.9% weight loss at 450° C. in 30 minutes under nitrogen). However, the 30 min heating period used in the evaluation of thermal stability is shorter than the time needed to manufacture complex integrated circuits. Multiple deposition steps, annealing, and metalizing steps significantly increase the time during which a wafer is exposed to high temperatures. Thus, this dielectric material is unsuitable for manufacture of multilevel integrated circuits.

Shimogaki et al., *Proc. 3d Int. DUMIC Conference,* 189–196 (1997) modified $SiO_2$ using $CF_4$ and $SiH_4$ with $NO_2$ as oxidant in a PECVD process. The process resulted in a polymer with a dielectric constant of 2.6, which is lower than that of $SiO_2$.

However, one would expect low thermal stability due to low bonding energy (BE) of $sp^3$C—F and $sp^3$C—Si bonds (BE=110 and 72 kcal/mol., respectively) in the film. The low thermal stability would result in films which could not withstand the long periods at high temperatures necessary for integrated circuit manufacture.

B. Amorphous-Carbon ($\alpha$C)- and Fluorinated Amorphous Carbon (F-$\alpha$C)-Containing Low Dielectric Materials The second approach described involves the manufacture of $\alpha$-carbon and $\alpha$-fluorinated carbon films. Robles et al., *Proc. 3d Int. DUMIC Conference,* 26–33 (1997) used various combinations of carbon sources including methane, octafluorocyclobutane and acetylene with fluorine sources including $C_2F_6$ and nitrogen trifluoride ($NF_3$) to deposit thin films using a high density plasma (HDP) CVD process.

The fluorinated amorphous carbon products had dielectric constants as low as 2.2 but had very poor thermal stability. These materials shrank as much as 45% after annealing at 350° C. for 30 minutes in nitrogen.

One theory which could account for the low thermal stability of the fluorinated amorphous carbon products is the presence of large numbers of $sp^3$C—F and $sp^3$C—$sp^3$C bonds in the polymers. These bonds have low bonding energy and therefore cannot withstand the long periods of high temperatures necessary for IC manufacture.

Several thermally stable polymers or polymer precursors are under study. These include polyimides (PIM), fluorinated polyimides (F-PIM), polyquinoxalines (PQXL), benzocyclobutenes (BCB), fluorinated polyphenylethers (F-PPE), and several types of silsesquisiloxanes. These polymers have dielectric constants ranging from 2.6 to 3.0. Solutions of these polymers or their precursors are used in spin coating processes to achieve gap filling and planarization over metal features. However, the dielectric constants of these polymers are too high for the future ICs with small feature sizes. In addition, all thermally stable polymers including PIM and PQXL have a persistent chain length (PCL or the loop length of a naturally curling up polymer chain) up to several hundred or thousands of Å. Long PCL makes complete gap filling very difficult if not physically impossible.

C. Polymers Containing Aromatic Moieties

Recently, other types of low dielectric material, poly (para-xylylenes) (PPX) have been studied and evaluated for future IC fabrication. These PPX include Parylene-N™, Parylene-C™ & Parylene-D™ (trademarks of Special Coating System Inc.'s poly(para-xylylenes). Currently, all commercially available poly(para-xylylenes) are prepared from dimers. The currently available starting materials or dimers for manufacturing poly(para-xylylenes) are expensive (more than $500 to $700/kg). Unfortunately, these poly(para-xylylenes) have dielectric constants (K=2.7–3.5) and low thermal stability. The decomposition temperature, Td is less than 320° C.–350° C. in vacuum, and thus these materials are not suitable for IC fabrication requiring high temperature processing. The fluorinated poly(para-xylylenes) (F-PPX) or Parylene AF-4™ for example, has the structure of (—CF$_2$—C$_6$H$_4$—CF$_2$—)$_n$. It has a dielectric constant of 2.34 and is thermally stable (0.8%/hr. wt. loss at 450° C. over three hours in nitrogen atmosphere).

II. Processes for Manufacturing Polymers

Currently, fluorinated poly(para-xylylenes) are polymerized from F-dimers by the method of Gorham, (*J. Polymer Sci.* A1(4):3027 (1966)) as depicted in Reaction 1 below:

Reaction 1

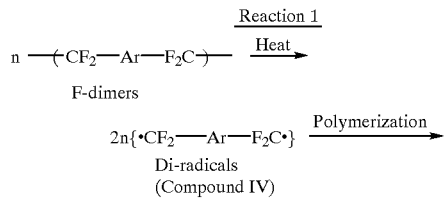

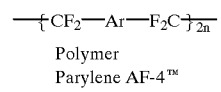
Polymer
Parylene AF-4™

In this reaction, Ar is —C$_6$H$_4$—. However, the precursor molecule and the F-dimer needed for the manufacture of Parylene AF-4™ is expensive and time-consuming to make because several chemical reaction steps are needed to make its fluorinated dimer.

F-dimers are manufactured according to the following series of chemical steps:

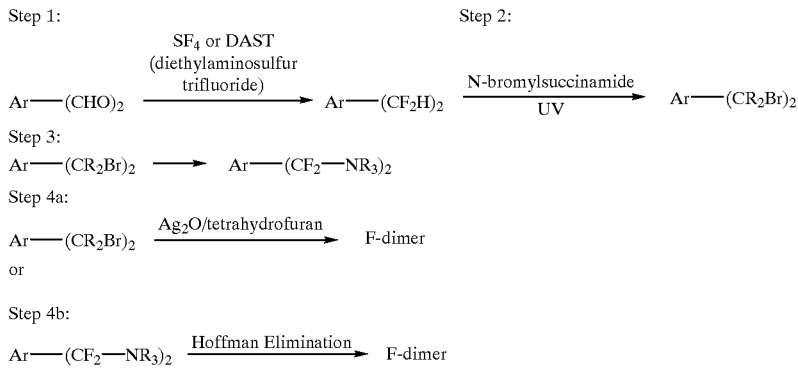

The overall yield for making F-dimers is low (estimated from 12% to 20% based on the weight of its starting material). In addition, the last step of the syntheses of the precursor, or the dimerization step (4a or 4b) can only be effectively carried out in very dilute solutions (from 2% to less than 10% weight/volume) resulting in low conversion efficiency. Further, the needed lead time and material cost for making F-containing dimers is very high. For instance, 10 g of the F-dimer can cost as much as $2,000/g. The lead time is 2–3 months for getting 1 kg of sample from current pilot plant production facilities.

Therefore, even though fluorinated poly(para-xylylenes) might be suitable as dielectric materials in "embedded" IC structures, it is very unlikely that the F-dimer will ever be produced in large enough quantity for cost-effective applications in future IC fabrication.

On the other hand, a readily available di-aldehyde starting material (Compound Ia) is reacted with sulfurtetrafluoride at elevated pressure of 1 MPa to 20 MPa and temperatures of 140° C. to 200° C. to yield the tetrafluorinated precursor (Compound IIIa) and sulfur dioxide (Reaction 2). The sulfur dioxide is then exhausted from the reaction chamber. Alternatively, the di-aldehyde can be reacted with diethylaminosulfur trifluoride (DAST) at 25° C. at atmospheric pressure to make the Compound IIIa.

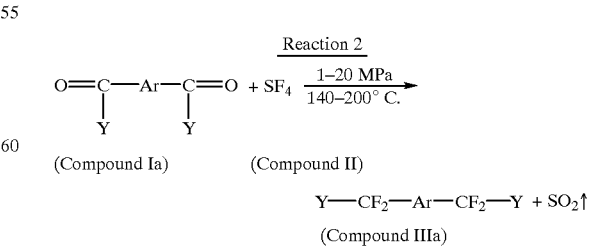

Y is a leaving group, and Ar is a phenylene moiety. Both Compound Ia and Compound IIIa have non-fluorinated phenylene moieties. The Compound IIIa in solution can be converted into a dibromo Compound IIIb (see below, Reaction 3) through a photo-reaction (Hasek et al., *J. Am. Chem. Soc.* 82:543 (1960). The dibromo Compound IIIb (1–5%) was used in combination with CF$_3$—C$_6$H$_4$—CF$_3$ by You, et al., U.S. Pat. No. 5,268,202 to generate di-radicals (Compound IV) that were transported under low pressure to a deposition chamber to make thin films of fluorinated poly(para-xylylenes).

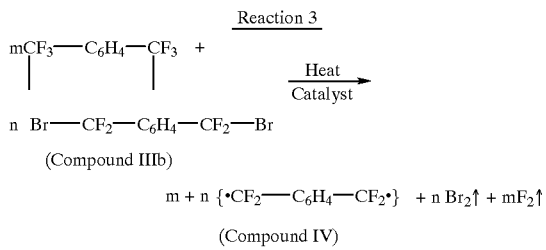

Additionally, poly(para-xylylene)-N (Parylene-N™ or PPX-N) was also prepared directly from pyrolysis of p-xylene. (Errede and Szarwe, *Quarterly Rev. Chem. Soc.* 12:301 (1958); Reaction 4). According to this publication, highly cross-linked PPX-N was obtained.

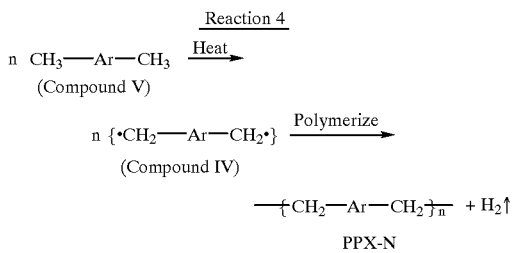

III. Deposition of Polymer Films

The deposition of low dielectric materials onto wafer surfaces has been performed using spin on glass (SOG), but for newer devices which have features smaller than 0.25 μm, SOG processes cannot fill the small gaps between features. Therefore, vapor deposition methods are preferred. Of these, transport polymerization (TP) and chemical vapor deposition (CVD) are most suitable.

In both TP and CVD, the precursor molecule is split (cracked) to yield a reactive radical intermediate which upon deposition onto the wafer can bind with other reactive intermediate molecules to form a polymer. The polymer thus forms a thin film of material with a low dielectric constant.

Chemical vapor deposition has been used to deposit thin films with low dielectric constant. Sharangpani and Singh, *Proc. 3d Int. DUMIC Conference,* 117–120 (1997) reported deposition of amorphous poly(tetrafluoroethylene) (PFTE; Teflon™, a registered trade name of DuPont, Inc.) by a direct liquid injection system. A solution of PFTE is sprayed on a wafer substrate, which is exposed to ultraviolet light or with light from tungsten halogen lamps. Unfortunately, PFTE has a low glass transition temperature (Tg) and cannot be used for IC fabrication requiring temperatures of greater than 400° C.

Labelle et al., *Proc. 3d Int. DUMIC Conference,* 98–105 (1997) reported using pulsed radio frequency (RF) plasma enhanced CVD (PECVD) process for deposition of hexafluoropropylene oxide. However, as with poly (tetrafluoroethylene), the resulting polymers have low Tg values and cannot be used as dielectrics.

Kudo et al., *Proc. 3d Int. DUMIC Conference,* 85–92 (1997) reported using a PECVD process for deposition of hydrocarbons including C$_2$H$_2$/(C$_2$H$_2$+C$_4$F$_4$).

Lang et al., *Mat. Res. Soc. Symp. Proc.* 381:45–50 (1995) reported thermal CVD process for deposition of poly (naphthalene) and poly(fluorinated Naphthalene). Although polymers made from these materials have low dielectric constants, the polymers are very rigid, being composed of adjoining naphthalene moieties. Thus, they are prone to shattering with subsequent processing such as Chemical Mechanical Polishing (CMP).

Selbrede and Zucker, *Proc. 3d Int. DUMIC Conference,* 121–124 (1997) reported using a thermal TP process for deposition of Parylene-N™. The dielectric constant of the resulting polymer (K=2.65–2.70) also was not low enough. For future IC applications, the decomposition temperature (Td) of the thin film was also too low to withstand temperatures greater than 400° C.

Wang et al., *Proc. 3d Int. DUMIC Conference,* 125–128 (1997) reported that annealing a deposited layer of poly (para-xylylene) increases the thermal stability, but even then, the loss of polymer was too great to be useful for future IC manufacturing.

Wary et al. (*Semiconductor International,* June 1996, pp: 211–216) used the fluorinated dimer, the cyclo-precursor ( , , ', ', tetrafluoro-di-p-xylylene) and a thermal TP process for making polymers of the structural formula: {—CF$_2$—C$_6$H$_4$—CF$_2$—}$_n$. Films made from Parylene AF-4™ have dielectric constant of 2.28 and have increased thermal stability compared to the hydrocarbon dielectric materials mentioned above. Under nitrogen atmosphere, a polymer made of Parylene AF-4™ lost only 0.8% of its weight over 3 hours at 450° C.

All current commercial or laboratory deposition systems used for transport polymerization of dimers primarily consist of (1) a vaporizer for the solid dimers, (2) a pyrolyzer to crack the dimers and (3) a deposition chamber. The configuration for a commonly used commercial system is shown in the attached FIG. 1. FIG. 1 shows a general diagram of a prior art transport polymerization system 100 using solid dimers. A door 104 permits the placement of precursors into the vaporizer 108. The vaporized precursors are transported to the pyrolyzer 112, where the precursors are thermally cleaved into reactive intermediates. The intermediates are then transported via a pipe 116 to the chamber 120 and chuck 124, where the intermediates polymerize on the wafer surface. A valve 132 permits the chamber pressure to be lowered by a dry pump 136 keeps the pressure of the system low, and the cold trap and mechanical chiller 128 protects the pump from the unpolymerized molecules in the chamber.

In addition, You and his coworkers patented a so called "one chamber system" for transport polymerization of liquid monomers such as Dibromotetrafluor-p-xylene (DBX) and 1,4-bis-(trifluoromethyl) benzene (TFB) U.S. Pat. No. : 5,268,202). In their deposition system, shown in FIG. 2, both the pyrolyzer and the wafer are situated inside the same vacuum chamber. The system also utilizes a resistive heater to crack the DBX and TFB.

The reactor of You et al. comprises a vacuum chamber 10 containing a reactor 12 which contains a metal catalyst 16. The reactor is heated by a resistive heater 18 and a heat shield 22 surrounds the reactor. Precursors are fed into the reactor via a reactor supply tube 24 and are stored in a storage container 26. Flow of precursors from the storage container into the reactor is regulated by a control valve 28. The reactor has an outlet 29 through which dissociated precursors flow. A shutter 30 is used to protect the wafer 14 from being exposed to the high heat of the reactor, to keep metal catalyst ions inside the reactor, and to act as a diffusion plate. The wafer 14 is held on a cooling device 34 which keeps the temperature of the wafer below that of the reactor. An outlet port 44 is disposed on the bottom of the vacuum chamber and is connected to mechanical and diffusion pumps.

However, the resistive heater has very low heating rate and long temperature stabilization time. Thus, it is not suitable for future IC manufacturing equipment. Furthermore, all current pyrolyzers utilize metal parts which potentially leach out metal ions under high temperature (>600 to 800° C.). These metal ions result in metallic contamination of deposited thin films. Moreover, the precursor inlet port and outlet port 44 are on the same end of the chamber, namely at the end opposite the end where the wafer is held. Further, the wafer is protected by a heat shield which must be kept close to the heat source, and thus, is not ideally suited to act as a diffusion plate to ensure the even distribution of intermediates onto the wafer surface. Thus, deposition of precursors onto the wafer surface is not easily regulated and the thickness of dielectric films cannot be made constant over the entire wafer surface.

In contrast to a CVD process, transport polymerization (TP) (Lee, C. J., Transport Polymerization of Gaseous Intermediates and Polymer crystal Growth." *J. Macromol. Sci.—Rev. Macromol. Chem.* C16:79–127 (1977–1978), avoids several problems by cracking the precursor in one chamber and then transporting the intermediate molecules into a different deposition chamber. By doing this, the wafer can be kept cool, so that metal interconnect lines on the wafer are not disrupted, and multiple layers of interconnect films may be manufactured on the same wafer. Further, the conditions of cracking can be adjusted to maximize the cracking of the precursor, ensuring that very little or no precursor is transported to the deposition chamber. Moreover, the density of the transported intermediates may be kept low, to discourage re-dimerization of intermediates. Thus, the thin films of low dielectric material are more homogeneous and more highly polymerized than films deposited by CVD. These films have higher mechanical strength and can be processed with greater precision, leading to more reproducible deposition and more reproducible manufacturing of integrated circuits.

Among all currently available poly(para-xylylenes), F-PPX ((—$CF_2$—$C_6H_4$—$CF_2$—)$_n$ or Parylene AF-4™) has the lowest dielectric constant and best thermal stability. This is due to a lower polarity and higher bonding energy of C—F bond compared to those of C—H bond. So far, the F-PPX is considered to be the most promising "embedded" IMD for future 0.18 μm ICs due to its low dielectric constant (K=2.34) and high thermal stability (0.8%/hr. wt. loss at 450° C. up to 3 hours). However, to be useful as interlevel dielectric materials, a lower K (K<2.3–2.5) polymer still needs to have better thermal stability, $T_d$ and thermal mechanical strength than those of the Parylene AF-4™. Higher $T_d$, glass transition temperature $T_g$ and Elastic Modulus are needed for re-flow or annealing of aluminum or copper. In addition, higher Tg and Elastic Modulus (E) are desirable for CMP to achieve global planarization. The development of new precursors and polymers requires new equipment for their dissociation and deposition, respectively. Certain of the precursors of the co-pending applications require carefully controlled conditions of precursor dissociation. Those precursors are described in the above identified co-pending applications. Such careful control over process conditions are impossible using conventional equipment. In this invention, new equipment for dissociation of precursors and deposition of polymers are provided to overcome the above mentioned problems.

SUMMARY OF THE INVENTION

The present invention is directed to overcoming the disadvantages of the prior art.

One object of this invention is the design of new equipment for chemical vapor deposition of materials with low dielectric constants and high thermal and mechanical stability.

Another object is the design of new equipment for transport polymerization of materials with low dielectric constants and high thermal and mechanical stability.

A further object of this invention is the design of new equipment for dissociation of precursors which utilizes thermal processing.

A yet further object of this invention is the design of new equipment for dissociation of precursors which utilizes catalysts.

Yet another object of this invention is the design of new equipment for dissociation of precursors which utilizes photons as an energy source.

Another object of this invention is a device for photon-assisted dissociation of precursors which utilizes infrared radiation as an energy source.

Yet another object of this invention is a device for photon-assisted dissociation of precursors which utilizes ultraviolet radiation as an energy source.

A yet another object of this invention is a device for photon-assisted dissociation of precursors which utilizes vacuum ultraviolet radiation as an energy source.

Yet another object of this invention is a device for photon-assisted dissociation of precursors which utilizes dielectric barrier discharge to generate vacuum ultraviolet radiation as an energy source for dissociation of precursors.

A further object of this invention is the design of new equipment for dissociation of precursors which utilizes radio frequency plasmas.

A yet further object of this invention is the design of new equipment for dissociation of precursors utilizing microwave plasmas.

Yet another object of this invention is the design of new equipment for dissociation of precursors which utilizes high density plasma.

Another object of the invention is a device for plasma dissociation of precursors which utilizes alternating electrical and magnetic fields to mix the plasma.

Another further object of this invention is the design of new equipment for deposition of dissociated precursors which permits the formation of cross-linked polymers.

A yet another object of this invention is the design of new equipment for regulating the deposition of dissociated precursors on substrates.

A yet other object of the invention is a device for deposition of multiple layers of polymer on a substrate.

A yet further object of this invention is the manufacture of polymer thin films deposited on substrates.

Yet another object of this invention is the manufacture of integrated circuit chips made with the newly designed equipment for dissociation and deposition of polymer thin films.

Therefore, the invention is directed at new equipment designed for transport polymerization and chemical vapor deposition of polymers with low dielectric constants and high thermal and mechanical stability.

Other objects, aspects and advantages of the invention can be ascertained from the review of the additional detailed disclosure, the examples, the figures and the claims.

BRIEF DESCRIPTION OF THE FIGURES

FIG. 4 depicts an embodiment of the invention used for photon assisted transport polymerization (PATP) of polymers using ultraviolet (UV), vacuum ultraviolet (VUV), and/or infrared (IR) sources.

FIG. 4b depicts another embodiment of a photon assisted transport system.

FIG. 4c depicts another embodiment of a photon assisted transport polymerization system.

FIG. 10 depicts a cluster tool comprising a multiple separate chambers for transport polymerization of low dielectric polymers.

FIG. 11 depicts an embodiment of a semiconductor wafer of the invention with a thin film dielectric layer and imbedded integrated circuit features.

DETAILED DESCRIPTION OF THE PREFERRED EMBODIMENT

Figure 1:
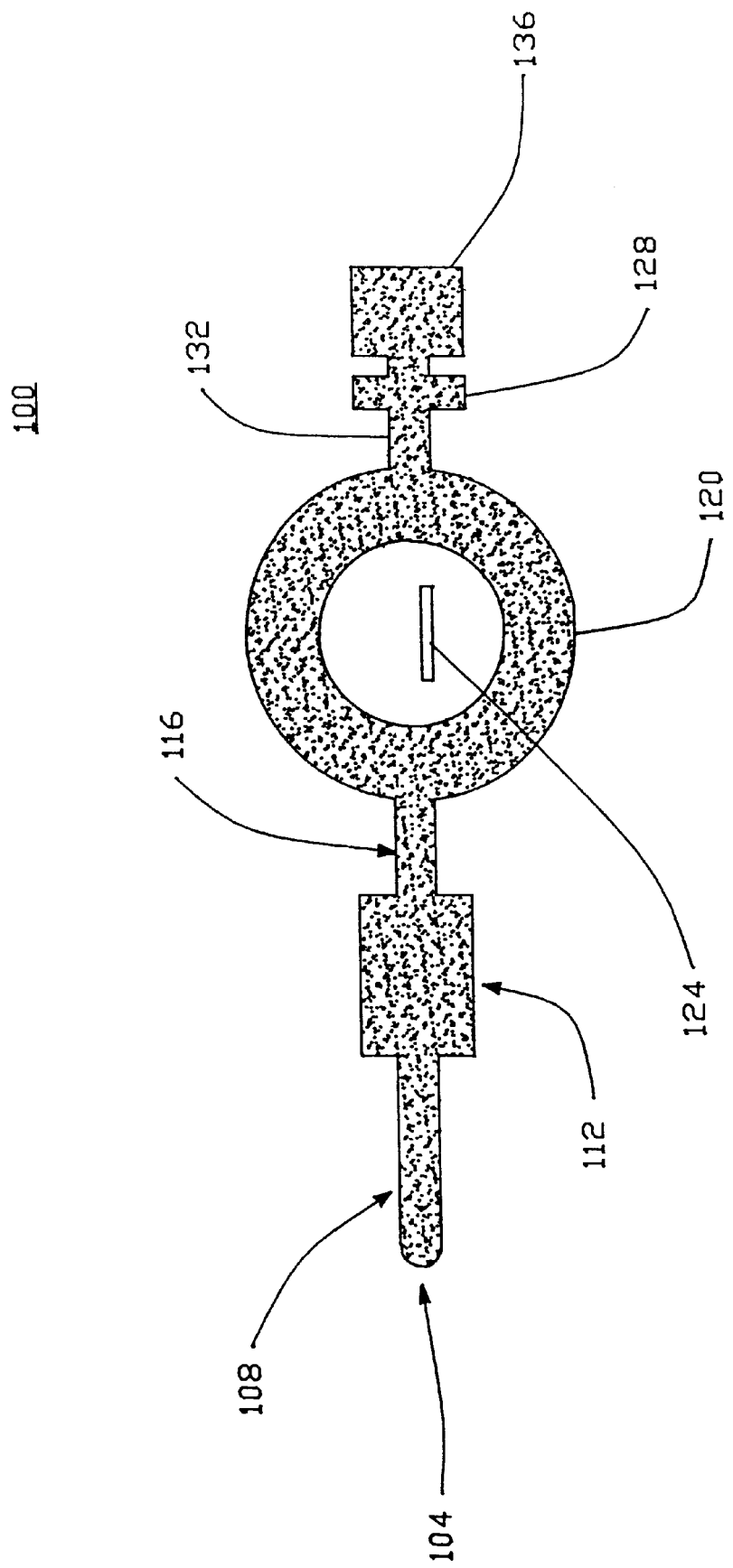
FIG. 1 depicts prior art equipment for transport polymerization of low dielectric polymers.

I. Starting Materials and Generation of Polymer Precursors

This invention represents improvements in the ways in which polymers are made for integrated circuit manufacture. Starting materials are first synthesized into precursors, which are introduced into the equipment. Next, the precursors are dissociated (cracked) to form reactive intermediates, which are then deposited onto a wafer substrate, where the intermediates polymerize to form polymer thin films. Several different types of starting materials and precursors are used with the present invention.

A. Fluorocarbon-Modified $SiO_2$: Fluorinated Silanes and Fluorinated Siloxanes

The first category of precursors consists of precursors for making fluorocarbons, fluorinated silanes and fluorinated siloxane. These precursors are useful for modifying $SiO_2$ by incorporating Si—C bonds, Si—F bonds, and/or fluorinated aromatic bonds. Incorporation of these types of bonded moieties into $SiO_2$ can lower the dielectric constant, but with only small decreases of the Td, Tg, E, and G of the polymers from which they are made.

Precursors of fluorinated silanes in this invention have the general structural formula: $(C_6H_{5-n}F_n)_m$—$SiH_{4-m}$, wherein n is 1, 2, 3, 4 or 5 and m is an integer of 1, 2, 3 or 4. The preferred fluorinated silane of the present invention is $C_6F_5$—$SiH_3$.

Precursors of fluorinated siloxanes of this invention have the general structural formula: $(C_6H_{5-n}F_n)_m$—$Si(OCH_3)_{4-m}$, wherein n is 1, 2, 3, 4 or 5, and m is 1, 2, or 3. The preferred fluorinated siloxane of the present invention is $(C_6F_5)$—$Si(OCH_3)_3$.

Precursors of fluorinated hydrocarbons have the general structural 0, formula: $CH_{3-n}F_n$—$C_6H_{4-p}F_p$—$CH_{3-m}F_m$, wherein n and m are 1, 2 or 3, and p is 1, 2, 3, or 4. Preferred fluorinated hydrocarbon precursors are $CF_3$—$C_6F_4$—$CF_3$ and $CHF_2$—$C_6F_4$—$CHF_2$.

There are many isomers with these above general formulas, and all are considered part of the present invention.

TABLE 1

Precursors and Methods for Manufacturing Low Dielectric $SiO_2$ Derivatives

| C & F-source | Si Source | Oxidant | TP and CVD Processes |
|---|---|---|---|
| $C_6F_5$—$SiH_3$ | $SiH_4$ | $H_2O_2$, $NO_2$ | Thermal |
| $C_6F_5$—$Si(OCH_3)_3$ | — | — | Plasma Enhanced |
| $CF_3$—$C_6F_4$—$CF_3$ | $SiH_4$ | — | Plasma Enhanced |

Table 1 shows the precursors, other reactants and TP and CVD processes used to manufacture fluorine-substituted aromatic $SiO_2$ derivatives of this invention. Although the fully fluorinated derivatives are described, mono-, di-, tri- and tetra-fluorinated aromatic moieties, as appropriate, can also be used.

B. Precursors for Making Fluorinated Amorphous Carbon- and Polymer-Containing Materials With Low Dielectric Constants These precursors consist primarily of $sp^2C$=$sp^2C$, $sp^2C$—F and/or hyperconjugated $sp^3C$—F bonds. Unlike the precursors used for making silanes and siloxanes, no Si source is needed. Precursors for fluorinated polymers with one aromatic ring and one $sp^2C$—$sp^3C$—F type bond have the general formula: $(C_6H_{5-n}F_n)$—$CH_{3-m}F_m$, where n is an integer of 1, 2, 3, 4, or 5, and m is an integer of 1, 2, or 3. A preferred precursor of a fluorinated polymer is $C_6F_5$—$CF_3$.

Precursors for fluorinated polymers with one aromatic ring and two $sp^2C$—$sp^3C$—F type bonds have the general formula: $(CH_{3-n}F_n)$—$(C_6H_{4-p}F_p)$—$(CH_{3-m}F_m)$, wherein n and m are integers selected from the group consisting of 1, 2 and 3, and p is an integer selected from the group consisting of 0, 1, 2, 3, and 4. The precursors of fluorinated polymers which are commercially available include $CF_3$—$C_6F_4$—$CF_3$ and $CHF_2$—$C_6F_4$—$CHF_2$.

Precursors of polymers containing one fluorinated aromatic residue and an additional conjugated $sp^2C$ carbon bond have the general structural formula: $(C_6H_{5-n}F_n)$—$CH_{1-m}F_m$=$CH_{2-p}F_p$, where n is an integer of 1, 2, 3, 4, or 5, m is an integer of 0 or 1, and p is an integer of 0, 1, or 2. The preferred precursor of this group is $C_6F_5$—$CF$=$CF_2$.

There are many isomers with these above general formulas, and all can be used with the present invention.

TABLE 2

Precursors for Making Low Dielectric Hydrocarbon Polymers

| C & F-sources | Primary α-C Source | TP or CVD Process |
|---|---|---|
| $C_6F_5$—$CF_3$ | $CH_4$ | High Density Plasma |
| $C_6F_5$—$CF$=$CF_2$ | $CH_4$ | High Density Plasma |
| $HCF_2$—$C_6F_4$—$CF_2H$ |  | Thermal or Photon Assisted |
| $CF_3$—$C_6F_4$—$CF_3$ |  | Photon Assisted |

C. Novel Aromatic Moieties in Precursors

New starting materials and precursors used in this invention contain aromatic moieties which have at least 6 to about 40 carbon atoms. The precursors can be classified according to the following formulas:

$$—C_6H_{(4-n)}F_n—,$$

wherein n is an integer ranging from 1 to 4;

$$—C_{10}H_{(6-n)}F_n—,$$

wherein n is an integer ranging from 0 to 6;

$$—C_{12}H_{(8-n)}F_n—,$$

wherein n is an integer ranging from 0 to 8;

$$—C_{13}H_{(7-n)}F_n—,$$

wherein n is an integer ranging from 0 to 7;

$$—C_{14}H_{(8-n)}F_n—,$$

wherein n is an integer ranging from 0 to 8;

$$—C_{16}H_{(10-n)}F_n—,$$

wherein n is an integer ranging from 0 to 10;

the di-phenylenyl moiety (—$C_{10}H_{(8-n)}F_n$—) where n is an integer of from 0 to 8 consists of two phenylenyl moieties covalently linked together; anthracenyl (—$C_{14}H_{(6-n)}F_n$—) moieties wherein n is an integer of from 0 to 6; phenanthrenyl (—$C_{14}H_{(8-n)}F_n$—) moieties wherein n is an integer of from 0 to 8; pyreneyl (—$C_{16}H_{(8-n)}F_n$—) moieties wherein n is an integer of from 0 to 8.

Moreover, covalently linking similar or different aromatic residues together creates larger aromatic moieties. For example, linking phenyleneyl and naphthenyl residues into a phenyleneyl-naphthenyl moiety results in an aromatic moiety with the structural formula: ($C_6H_{4-n}F_n$)—($C_{10}H_{6-m}F_m$), where n and m are integers. Similarly, linking a phenanthrenyl residue and a pyreneyl residue results in an aromatic moiety with the structural formula: —($C_{14}H_{(8-n)}F_n$)—($C_{16}H_{(8-n)}F_n$)—. All such combinations of the aforementioned aromatic moieties which consist of up to about 40 carbon atoms are considered to be part of this invention.

Numerous positional isomers exist for each of the above formulas. The term positional isomer refers to the relative location of the radical-containing moieties on the aromatic groups. In addition to positional isomers, the location of the fluorine atoms also may be different for each of the positional isomers. For instance, when the aromatic group has the general formula: —$C_{10}H_{(6-n)}F_n$—, there are 9 and 39 positional isomers for n=0 and 1 respectively. For each of these positional isomers, there are several fluorine-isomers. The number of these mono-fluoro-isomers is shown in parentheses. All partially or fully fluorinated aromatic moieties and all of the positional isomers are included in this invention.

However, not all of these positional isomers are equally useful in transport polymerization for the preparation of thin films for IC fabrication. Isomers, when formed into reactive intermediate di-radicals (Compound IV), may not form polymers at all. For example, in the (1, 2) isomer of Compound IV, the radical groups are too close together on the aromatic moiety, and the reactive intermediates will mostly form side products such as monomers and dimers and will not form polymers. When these monomers and dimers deposit on wafers along with polymers, the resulting thin films will be contaminated with liquid or powdered side products, and thereby becoming useless for IC fabrication. For the same reason, the (1, 8) isomer also is not useful.

These powdery dimers form on wafers when the vapor pressure is too high or/and its residence time, τ, inside the chamber is too long. Attempts to increase deposition rate by increasing the chamber pressure resulted in more dimer formation and resulting loss of deposition efficiency unless the residence time in the chamber is very low. The sufficiently short residence time needed to avoid powder formation on cold wafers can only be obtained by using small deposition chambers. Because the smallest chamber size is limited by the wafer diameter, the height of the chamber should be very small. Constraints on the dimensions of the chamber can lead to poor deposition patterns if the flow of intermediates is focused on a particular portion of the wafer. If the chamber is too small, there will be insufficient room to incorporate flow pattern adjusters or diffusion plates into the systems. Moreover, with small chamber dimensions, it is difficult to provide adequate devices for automated wafer handling.

On the another hand, intermediate di-radicals (Compounds IV) generated from the (1, 6) isomer will not form dimers because of the stearic hindrance of its bulky Ar group. For the same reason, except for the (1, 2) and (1, 8) isomers, other C-10 di-radicals will tend to not form side products on wafers even though they have a high residence time and/or are deposited under high vapor pressure. Therefore, these polymer precursors are favored for potentially obtaining much higher deposition rates.

Therefore, it is desirable to chose isomers in which the formation of dimers or monomers is not favored. By selecting the positional isomers such that the reactive groups are sufficiently far apart, dimer or monomer formation is minimized. It is desirable for the end-to-end length ($I_m$) to be at least 4 Å, and preferably, $I_m$ should be at least 6 Å. End-to-end length is calculated using bond angle and bond length of repeating units in the polymers.

Further description of the precursors and methods of manufacturing polymers is described in the above-identified co-pending applications. The precursors described in the above applications provide for polymers with low dielectric constant, high thermal stability, and high mechanical strength. High thermal stability and high mechanical strength are important requirements for meeting metal processing conditions during IC fabrication.

D. Preparation of Precursors from Di-Aldehyde Starting Materials

Reaction 5 below describes the preparation of a tetrafluoro precursor compound from sulfur tetrafluoride and a starting material:

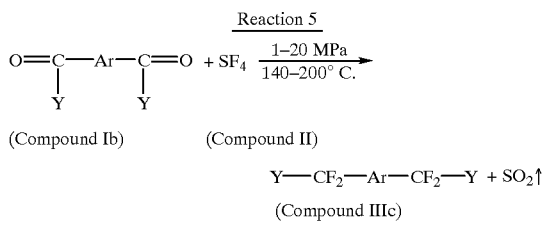

(Compound Ib)  (Compound II)

(Compound IIIc)

Compounds Ib and IIIc contain aromatic moieties containing at least one fluorine atom. Other precursors (Compound IIIc) can be prepared from the brominated derivatives of its tetrafluoro Compound IIIa (where Y=H). The reactive groups attached to aromatic moieties useful for polymerization of precursors of this invention are —CF$_2$Y, wherein Y is a leaving group selected from the group consisting of —H, —Cl, —Br, —NR, —SR, —SiR$_3$, —NR$_2$ and —SO$_2$R and wherein R is —H, an alky groupl or an aromatic mono-radical. Chow et al., *Jour. Org. Chem.* 35(1):20–21 (1970); Chow et al., U.S. Pat. No. 3,268,599; Hartner, U.S. Pat. No. 4,532,369. These references are incorporated herein fully by reference.

The above precursors have lower C—Y bonding energy than C—F bonds, thus providing lower processing temperatures when thermolytic methods are employed. For manufacturing linear, weakly-cross-linked polymers, preferred Y groups are —NR$_3$ and —SR. For manufacturing more highly cross-linked polymers, the preferred Y group is —H. The Ar is an aromatic radical consisting of at least 6 carbon atoms, preferably a F-containing aromatic radical comprising sp$^2$C—F bonding. sp$^2$C— refers to a bond type in which a carbon atom is connected to other elements with at least one double bond such as C=C. sp$^3$C— refers to a bond type in which a carbon atom is connected to other elements with single bonds such as those in C—F$_4$.

E. Dissociation of Precursors into Reactive Intermediates

Precursors are introduced into the equipment of this invention, where they are dissociated or cracked to form the reactive intermediates. The reaction used for the cracking of the precursors of the invention are described in Reaction 6:

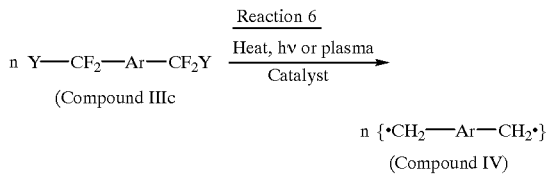

(Compound IIIc)

(Compound IV)

Figure 9:
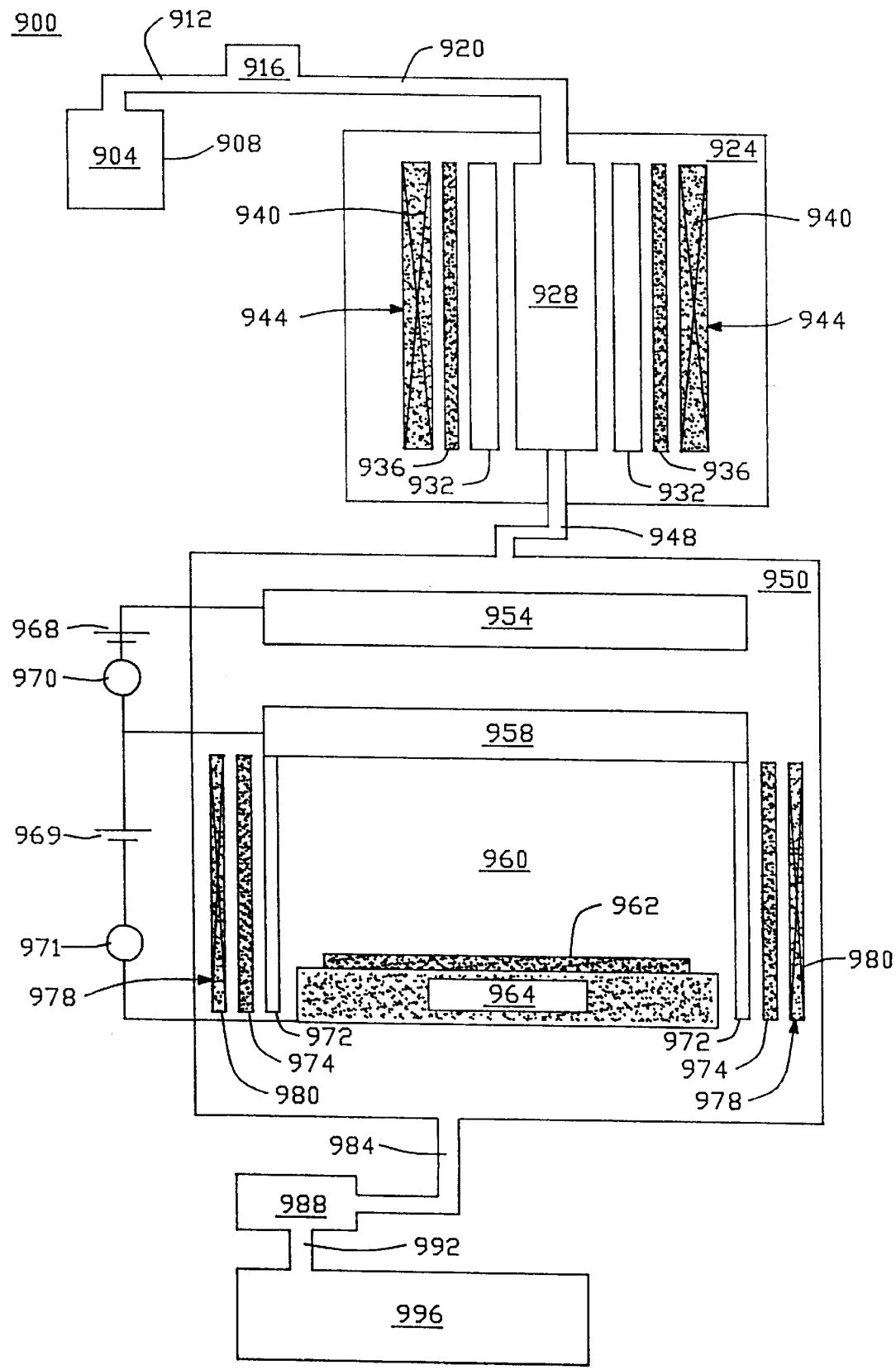
FIG. 9 depicts a combined transport polymerization and chemical vapor deposition apparatus utilizing combined photon and plasma processes.

In general, Compound IIIc can be prepared from its corresponding dialdehyde using SF$_4$ or DAST as fluorinating agents (see Reaction 1). The above tetrafluoro precursor Compound IIIc is fed into a transport polymerization system (FIGS. 3–10) where it is dissociated (cracked) using an energy source such as heat, plasma or photons, and is then transported into a deposition chamber and is finally deposited onto the surface of a wafer where the idealized di-radical intermediates (Compound IV) polymerize into a thin film of fluorinated poly(para-fluoroxylylene) material with a low dielectric constant. The above precursors can also be used in a chemical vapor deposition (CVD) system (FIG. 9). There, the precursor is placed directly on the wafer, which is then exposed to heat or light energy which cracks the precursor into intermediates (Compound IV), which then polymerize into a thin film.

One theory for the increased thermal stability of polymers is that the bonding energies of the sp$^2$C=sp$^2$C, sp$^2$C—F and sp$^2$C—sp$^3$C bonds of 145, 126, and 102 kcal/mol. respectively, are higher than that of sp$^3$C—H bonds (88 kcal/mol). A possible additional theory is that the sp$^3$C—F bonds may also be involved in hyperconjugation with sp$^2$C=sp$^2$C double bonds of the adjacent phenylene groups in the fluorinated poly(para-xylylene). This hyperconjugation renders a higher bond energy for the sp$^3$C—F bonds than that found in non-hyperconjugated sp$^3$C—F bonds.

Furthermore, brominated precursors generate molecular bromine, an environmentally unfriendly product. Replacement of —Br by —H results in the production of molecular hydrogen, which is environmentally friendly or can be burned easily and safely. This invention can also offer higher yields because the side product, molecular hydrogen, has a lower atomic weight than bromine.

II. Transport Polymerization and Chemical Vapor Deposition

Transport Polymerization (TP) and Chemical Vapor Deposition (CVD) of materials generally involves a multi-step process, wherein a precursor is cracked to form a reactive intermediate, and the reactive intermediates then can polymerize.

Transport polymerization begins with the cleavage of precursors to form reactive intermediates in one chamber. The reactive intermediates are then transported into a different chamber or to a different location in the same chamber for deposition on a substrate (usually silicon or silicon dioxide with metal features). In contrast, CVD processes occur in a single chamber wherein the dissociation of precursor and polymerization of polymer occur directly on the wafer. CVD is generally described in P. Van Zant, *Microchip Fabrication, A Practical Guide To Semiconductor Processing*, 3$^d$ edition, McGraw Hill, San Francisco (1997), incorporated herein fully by reference.

There are several types of TP and CVD which are defined by the energy sources used to crack the precursors. Thermal TP or CVD use heat energy, usually derived from a resistive heater. Infrared TP and CVD use IR radiation to heat the precursors. Photon assisted TP and CVD utilize the principal that light energy of certain wavelengths can break interatomic bonds resulting in the formation of the reactive intermediate radicals. Plasma enhanced TP and CVD utilize plasma energy derived from an electrical field derived from radio frequencies and/or from microwaves. High density plasma TP and CVD (HDPTP and HDPCVD) also use energy derived from radiofrequency generators. The types of TP and CVD processes useful for practicing the present invention are shown in Table 1.

TABLE 1

| Methods Used for Depositing Polymer Precursors | | | |
| --- | --- | --- | --- |
| | Thermal | Photon Assisted | Plasma Enhanced |
| TP | ** | ** | * |
| CVD | Impossible | Possible | ** |

Table 1 shows the preferred (**) methods for depositing precursors of this invention. Thermal CVD is currently impossible because the high temperatures needed to crack the precursor damage the aluminum metal lines and polymers on the wafers. Photon assisted CVD is possible, as is plasma enhanced transport polymerization (*).

A. Cracking Device Design

Cracking devices of this invention utilize several energy sources to dissociate precursors. Thermal processes rely upon resistive heaters or infrared radiation. Photon-assisted processes utilize infrared, ultraviolet, and/or vacuum ultraviolet radiation. Plasma-assisted processes utilize radiofrequency or microwave plasma energy sources. Special designs of each of these types of cracking devices are described below.

Optionally, a "hydrogen membrane" can be incorporated into the cracker design to filter out reaction by-products such as molecular hydrogen. Such hydrogen membranes have pores of from about 3 Å to about 5 Å in diameter. Materials suitable for making hydrogen membranes include silicon oxides or $Al_2O_3$. By placing such a hydrogen membrane on the lateral wall of the catalyst chamber, the molecular hydrogen diffuses out laterally from the cracking chamber whereas the cracked precursor is too large to pass through and exits the cracking chamber and flows into the deposition chamber. The use of such hydrogen membrane permits operation at higher chamber pressures than possible without such a membrane, while at the same time inhibiting re-reaction of radical intermediates with hydrogen to remake precursors. Without a hydrogen membrane, the maximum pressure is about 20 Torr, but with a hydrogen membrane, the chamber pressure can be greater than 20 Torr. For leaving groups other than —H, similar membranes with appropriately sized pores can also be used. The use of higher chamber pressures permits the more rapid flow of precursors into the device, and thereby permits the more rapid deposition of polymers.

B. Deposition Chamber Design

The deposition chambers of the equipment of this invention are designed to optimize the deposition of reactive intermediates to form polymers on wafer substrates. The new equipment incorporates moveable cold chucks and moveable gas dispersion plates, and moveable flow pattern adjusters. By adjusting the relative positions of the substrate, gas dispersion plates and flow pattern adjusters, the flow of reactive intermediates can be adjusted to achieve a desired deposition pattern of polymer. Moreover, by closely regulating chamber designs, the variables of chamber pressure and temperature can be adjusted to achieve desired polymer properties. Thus, unlike previous equipment this invention provides means for closely regulating the pattern of deposition of polymers onto substrates in semiconductor manufacturing.

1. Effect of Precursor Flow Rate and Chamber Pressure on Deposition

The pressure in the chamber affects the deposition of side products such as uncracked precursors and reaction by-products such as molecular hydrogen (or other di-Y moieties). If the pressure in the chamber is too high, the density of cracked precursors can increase sufficiently to permit intermolecular reactions to occur, resulting in the reformation of precursor molecules. The rate of di-radical recombination is a function of the mean free path of the di-radical intermediates. The mean free path is the average distance a di-radical molecule travels before encountering another molecule. At elevated chamber pressures, di-radicals can recombine. The recombination is also a function of the residence time in the chamber. Increasing the precursor flow rate at the same or constant pressure decreases the residence time of intermediates in the chamber. This decreased time decreases the opportunity for di-radical precursors to recombine.

Increasing the flow rate and/or chamber pressure permits the more rapid deposition of films onto wafer substrates. Alternatively, decreasing the chamber pressure or flow rate decreases the rate of polymer deposition. Thus, using the equipment of this invention, it is possible to increase flow rate and decrease chamber pressure to optimally balance deposition rate of polymer while minimizing deposition of side products.

The desired chamber pressures of this invention are in the range of from about 20 milliTorr to about 20 Torr. Above about 20 Torr, the mean free path of a di-radical intermediate is about 20 $\mu$m. Therefore, to ensure that reformation of di-radicals does not occur, the wafer must be close enough to the cracking device so that the edges of the wafer are no farther than 10 cm from the cracker. For a wafer of 20 cm diameter, the center of the cracker would have to be closer than about 3 mm from the wafer. This would result in much higher flow of radical intermediates over the center of the wafer than at the edges. Raising chamber pressure to above about 20 Torr increases the chances of di-radical reformation. Therefore, at chamber pressures above about 20 Torr, deposition is uneven and side products deposit.

Therefore, the optimum pressure is below about 10 Torr. For depositing polymers on larger wafers, even lower pressure is desirable.

2. Effect of Chamber Temperature on Polymer Deposition

The wafer deposition temperature determines not only the deposition rate, but also the mechanical properties of the resulting polymer. For example, PPX-N deposited at lower temperatures (below −20° C. to −30° C.) have lower elastic modulus and higher elongation at the film's breaking point, due to lower crystallinity compared to PPX-N deposited at higher temperatures. The temperature of the chuck and wafer can be as low as the temperature of liquid nitrogen (−196° C.) to as high as about 30° C. The preferred range of temperatures is from about −40° C. to about 30° C. Reducing the wafer temperature increases the rate of deposition of polymers on the substrate.

III. Types Of Equipment for Transport Polymerization and Chemical Vapor Deposition The novel equipment of this invention includes systems for transport polymerization and/or chemical vapor deposition using thermal, photon assisted, plasma assisted processes, and combinations of these different processes.

A. Thermal Transport Polymerization Using A Resistive Heater

Figure 2:
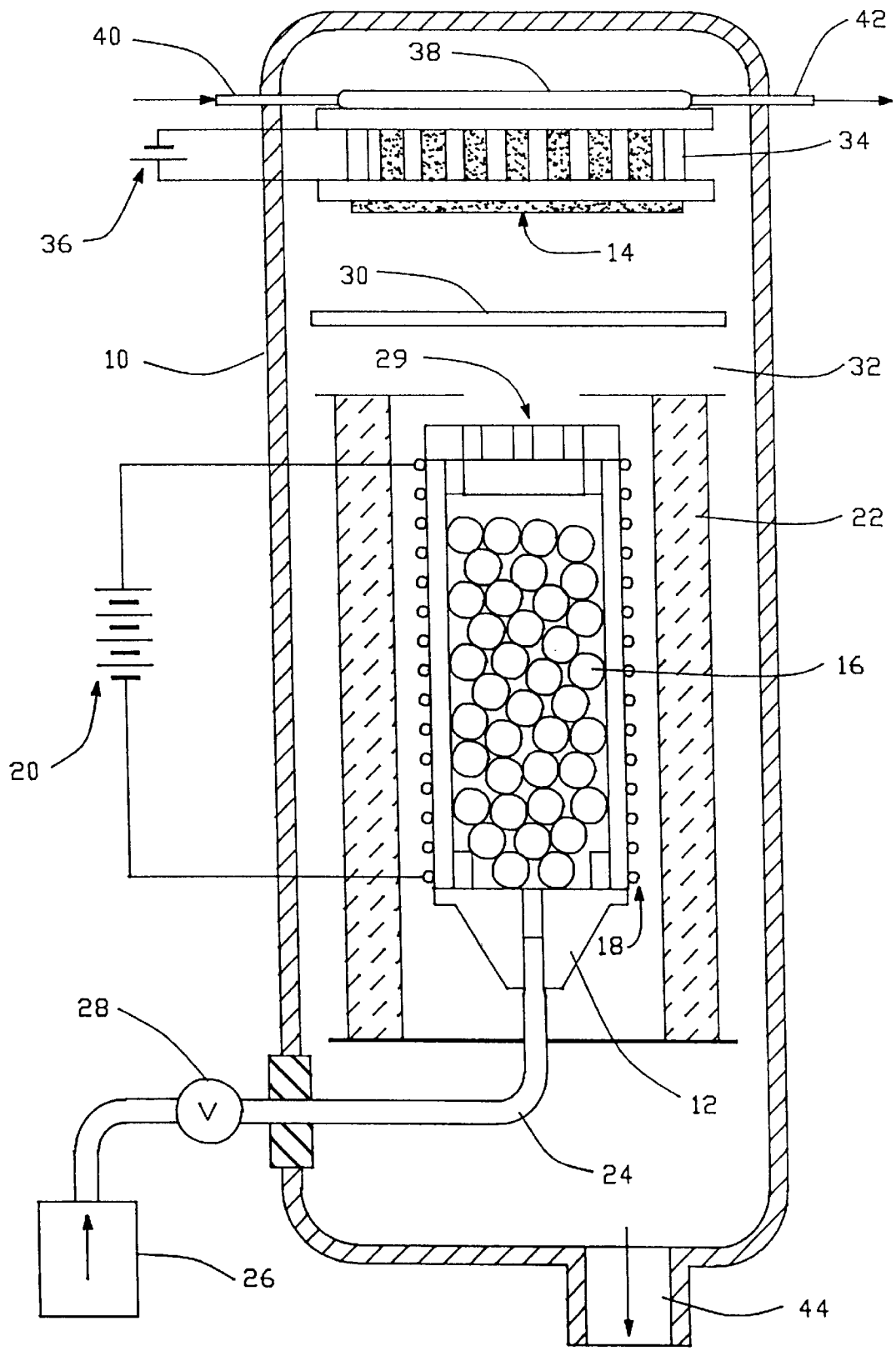
FIG. 2 depicts prior art equipment for transport polymerization of low dielectric polymers.

All current commercial poly(para-xylylenes) are prepared from thermolysis of its corresponding dimers (2,2 paracyclophanes) using the Gorham method. The dimers are cleaved in a furnace operated at temperatures ranging from 600° C. to 800° C. to generate the needed reactive intermediates or di-radicals. Similarly, thermolytic methods can be used to make polymers using the precursors described above. The thermolytic and photolytic processes generate reactive intermediates by breaking the C—Y bonds in the precursor, Compound IIIc. Because the bonding energy of the C—F bond is higher than that of the C—Y bond, thermolysis can be very effective at splitting the C—Y bonds, and can generate fluorinated di-radicals necessary for polymerization of the intermediates into fluorinated polymers. Thermal processing can be achieved using transport polymerization systems which are known in the art (FIGS. 1 and 2), or by using new transport polymerization systems (FIG. 3), which are new and novel.

Figure 3:
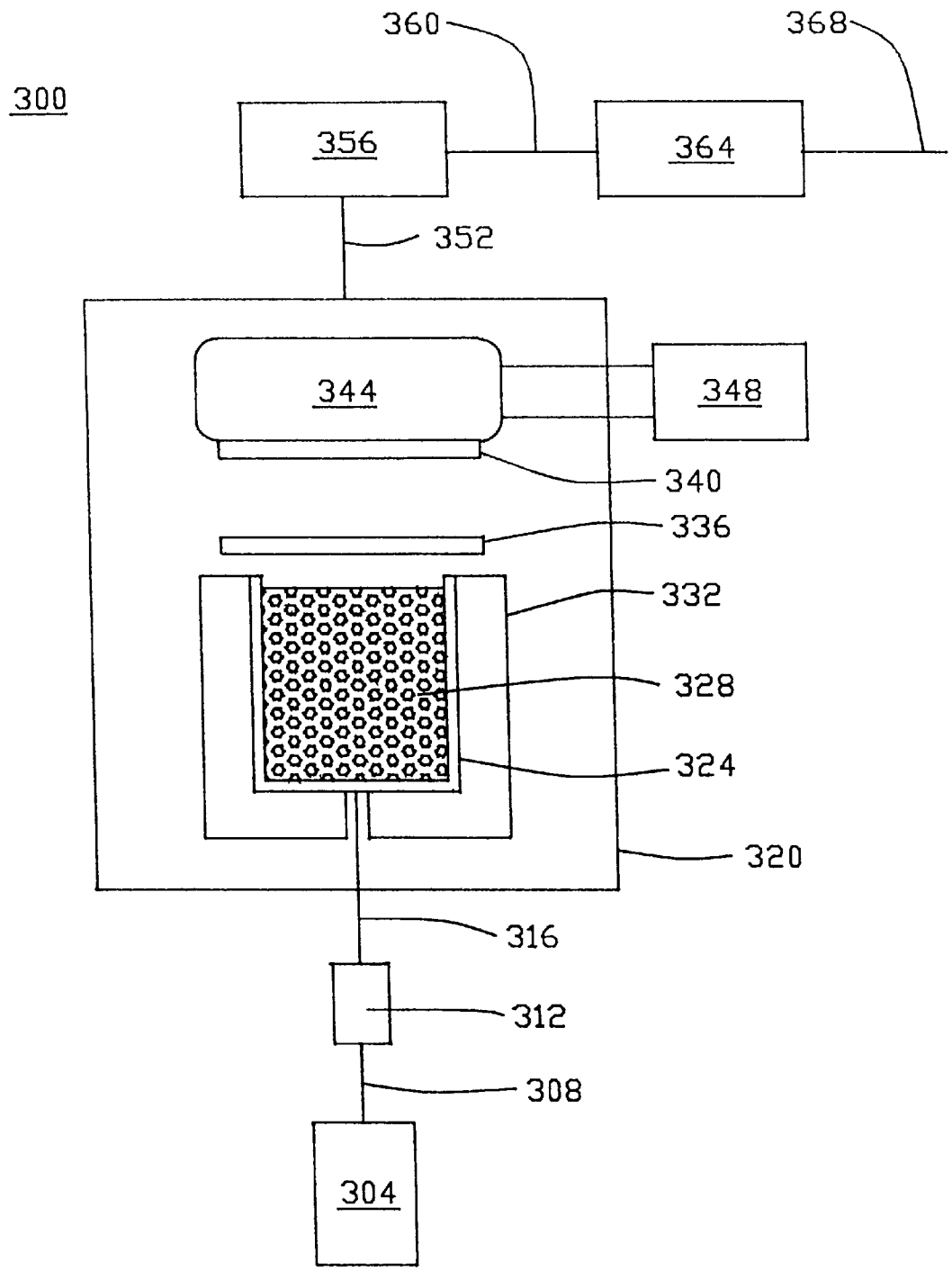
FIG. 3 depicts an embodiment of the invention having a single chamber used for thermolytic transport polymerization (TTP) polymers.
Figure 4A:
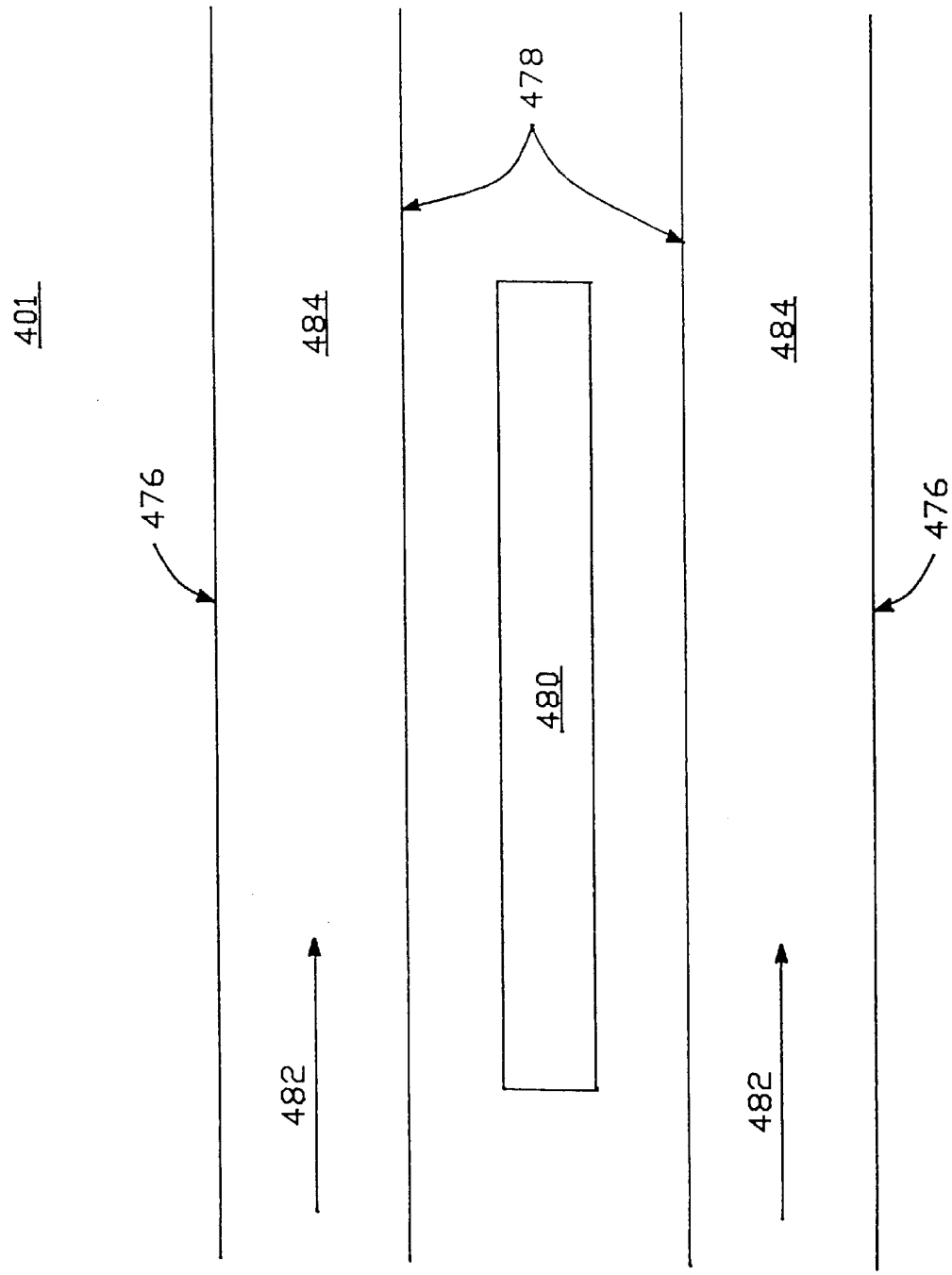
FIG. 4a depicts an embodiment of the invention in which the electromagnetic energy source is located inside the flow of precursors.

FIG. 3 shows a more specific schematic diagram of a novel thermolytic transport polymerization system 300 using a resistive heater. The liquid precursors are contained within a precursor tank 304, flow through a pipe 308 into a mass flow controller 312, are controllably released through another pipe 316 and into the chamber 320. The chamber wall is kept at temperatures ranging from 60° C. to 150° C. to prevent deposition of precursors on the chamber wall. Deposition of thin polymer films will be largely confined to the wafer as long as the wafer is maintained at relatively low temperatures. The chamber includes a container (cracking device) 324 which can be adapted to hold a catalyst 328 which will be described below. The cracking device contains a mesh to hold the catalyst in place. The precursor molecules are transported into the cracking device and are heated by a resistive heater 332 to generate the reactive intermediates. After leaving the cracking device, the intermediates are dispersed evenly over the wafer surface 340 by a diffusion plate 336 which also serves as a heat shield to protect the wafer from high temperatures. The diffusion plate is made of any suitable material, including but not limited to SiC, $SiO_2$, or ceramic materials, the diffusion plate can be either solid or porous.

The diffusion plate is moveable in 3 dimensions, and the cold chuck with attached wafer can also be moveable in three dimensions. By moving the cold chuck with the wafer and the diffusion plate relative to each other, the pattern of deposition of intermediates on the wafer surface is controlled. Thus, unlike previous equipment, this invention provides means for closely regulating the pattern of deposition of polymers onto substrates in semiconductor manufacturing. By controlling the pattern of deposition, one can thereby control the thickness and density of the polymer thin films.

The intermediates deposit upon the wafer 340, which is held on a cold chuck 344 which in turn, is connected to a chiller 348 to maintain a temperature of the chuck and wafer below the condensation temperature of the intermediates. The chiller is cooled by any conventional means, including liquid nitrogen or reverse Pietler effect. The pressure in the chamber 320 is reduced by a pump 364 connected via a pipe 360 to a trap 356, which is connected to the chamber 320. The ceiling temperature that an intermediate will condense on the wafer surface depends upon its chemical structure and the degree of vacuum. For tetrafluorobenzene di-radicals, the ceiling temperature ranges from about 30° C. to about 50° C. when the chamber pressure is in the range of from about 20 milliTorr to 100 milliTorr. The trap 356 prevents molecules such as precursor monomers and reactive intermediates from depositing inside the pump 364.

The cracking and deposition areas may be contained within the same chamber or in separate chambers which are connected together.

Depending on the temperatures and pressure in the pyrolyzer, thin films consisting primarily of either linear or highly cross-linked fluorinated polymers can be obtained. For instance, under higher pyrolyzer temperatures (>750° C.), cross-linked F-PPX tends to result from cracking of C—F bonds of the Compound IIIc. To generate cross-linked polymers, wherein H is a leaving group, it is necessary to select conditions favoring elimination of H and some of the F atoms, thereby creating multi-radical intermediates. For precursors in which the leaving group Y is H, and when catalysts are not used, temperatures of about 700° C. to about 800° C. are desirable. When catalysts are used, temperatures can be as low as about 400° C. When Y is Br or $SiR_3$, the ideal temperatures are from 500° C. to 750° C. Upon deposition on the wafer, these multi-radical intermediates form cross-links with adjacent polymer chains, thereby increasing the mechanical strength and thermal stability of the resulting polymer film.

Alternatively, to generate more linear polymers, the use of —SR and —$NR_3$ as leaving groups is preferred because their bonds can be selectively broken at different temperatures. At low pyrolysis temperatures (<700° C.), the SR and $NR_3$ groups will be eliminated, resulting in intermediates which deposit and form mostly linear polymers. When Y is SR, or $SO_2R$, temperatures in the range of 450° C. to 700° C. are desirable. At higher temperatures (>750° C. to about 800° C.), F atoms can also be dissociated from the precursors, forming multi-radical intermediates. As with those formed from H-containing precursors, the multi-radical intermediates can deposit to form polymers which are cross-linked.

The time for pyrolysis should be adjusted to ensure that nearly all of the precursor is dissociated. The time needed to complete the pyrolysis ranges from a few milliseconds to several hundred milliseconds. Furthermore, the temperatures needed to complete pyrolysis can be reduced by employing a catalyst in the chamber.

1. Catalysts

Catalysts are useful to assist the dissociation of precursors. The temperature required in thermolytic processes employing resistive heaters and/or infrared radiation can be reduced if a catalyst is incorporated into the cracking portion of the equipment of this invention. There are three types of catalysts useful in the reactors of this invention. They include dehydrogenation catalysts, debromination catalysts, and desulfurization catalysts. The type of catalyst used is dependent upon the leaving group of the precursor.

An ideal catalyst useful for this invention should provide high reactivity, high selectivity, long process life cycle, high recycle capability, and less severe pressure and temperature requirements. It should be inexpensive, safe for human handling, and should be environmentally friendly. The catalyst should crack or cleave the C—Y bond without cracking or cleaving the C—F bonds, if linear polymers are desired. Further, the catalyst should not add any metal or metal compound into the dielectric film during deposition. Serious reliability problems occur when a metal contaminant resides within the dielectric materials. Catalysts are held within the reaction chamber by a mesh. The mesh keeps the catalyst in place during the cracking reaction.

a. Dehydrogenation Catalysts

When Y is —H, any commonly used dehydrogenation catalyst is suitable. These catalysts are also called "protolytic cracking catalysts", or "oxidative dehydrogenation catalysts", in petroleum processing. Additionally, most "dehydrocyclization catalysts" and some of the "aromatization catalysts" for hydrocarbon processing are also useful for this invention, because aromatization normally involves dehydrogenation.

Potassium ferrite ($KFeO_2$) on iron oxide is an example of a suitable catalyst which is commercially available. The ferrite commonly comprises a promoter that may contain a salt of oxide of a Group (IIA) metal, such as Mg, Ca, or Sr, and a Group VB or VIB metal, such as V, Nb, Cr, Mo. or W. [See J. I. Krochiwitz ed., *Encyclopedia of Chemical Technology*, 4th edition, Catalysis and Catalysts, Vol. 5: 320 (1991), incorporated herein fully by reference.] These catalysts can be useful at temperatures up to about 600° C. Variations of these catalysts are BASF's Lu-144F™ and Shell 105™ catalysts, and catalysts for the dehydrogenation of ethylbenzene. These include those produced by Monsanto-Combustion Engineering-Lumis, Union Carbide- Cosden-Badger, and Societe-Chimique des Charbonnages. [See J. J. McKetta, Ed., *Encyclopedia of Chemical Processing and Designs: Dehydrogenation,* Vol. 14:276, Marcel Dekker Inc. (1992), incorporated herein fully by reference.]

Other industrial catalysts include Cu and Zn oxides on alumina and Cu, Ag or Cu—Ag alloy in the form of gauge or as metal deposited on a low surface area support such as kaolin, clay and active carbon. Other supports or carriers can include asbestos, pumice, kiesselguhr, bauxite, CuO, $Cr_2O$, $MgCO_3$, $ZrO_2$, and zeolites. These catalysts are active by virtue of an oxide layer on the metals, and are used for hydrogen generation from methanol. Catalysts consist of copper chromite, bismuth molybdate, iron molybdate, or tin phosphate on similar supports are also useful. [See J. I. Krochiwitz ed., *Encyclopedia of Chemical Technology, 4th edition,* Catalysis and Catalysts, Vol. 5: 320 (1991); J. J. McKetta, Ed., Encyclopedia of Chemical Processing and Designs: Dehydrogenation, Vol. 14:276, Marcel Dekker Inc. (1992). Both of these references are incorporated herein fully by reference.]

In addition to dehydrogenation catalysts, reforming catalysts used in petroleum reforming processes can also be used. A first group of these include transition metal oxides, such as $V_2O_5$, $MoO_3$, $WO_3$ and $Cr_2O_3$ in bulk form or preferred on a non-acid support such as silica, neutral alumina or active carbon. [See Meriaudeau and Naccache, *Cat. Rev.—Eng. Sci.* 39(1&2):5–48 (1997), incorporated herein fully by reference. Typically useful catalysts include Shell 205™, which consists of 62.5% $Fe_2O_3$, 2.2% $Cr_2O_3$, and 35.3% $K_2CO_3$, and Dow Type B™ catalyst, which consists of calcium and nickel phosphates promoted with a small amount of chromium oxide.

An additional group of catalysts useful for dehydrogenation include noble metals on acid supports. The most commonly used catalysts are Pt (0.3 to 0.7%) and Pt/Re on a chlorided (acidified) alumina (e.g., γ- or η-$Al_2O_3$). The bimetallic Pt/Re-alumina is preferred for its longer life time. In addition, Pt, Ga or Au modified H-ZSM-5™, or Pt on medium-pore zeolite support such as In-ZSM-5™ is also very effective.

Other, multimetallic reforming catalysts include Pt/Re catalysts of the above including lesser amounts of Ir, Ga, Ge, Sn or Pb supported by chloridated alumina. The catalysts typically have surface areas ranging from 170 $m^2/g$ to 300 $m^2/g$ and pore volumes ranging from 0.45 $cm^3/g$ to 0.65 $cm^3/g$. [See J. I. Krochiwitz ed., *Encyclopedia of Chemical Technology, 4th edition,* Catalysis and Catalysts, Vol. 5: 320 (1991).] Additionally useful catalysts can also be found in the OJG International refining catalyst compilation-1987 [J. J. McKetta ed., *Encyclopedia of Chemical Processing and Designs:* Petroleum Processing, Catalyst Usage, Vol 35:87–89 Marcel Dekker (1992).] These catalysts comprise active agents such as Pt/ReCl, Ni, PtCl and other rare earth metals on alumina and zeolites. The above references are incorporated herein fully by reference.

In addition to the catalysts mentioned above, many variations are possible. Notably, these catalysts include noble metals or metal sulfide on active carbon, (2) $Ga_{13}$, $Cr_{12}$, $GaAl_{12}$ & $Al_{13}$ on PILCs, (3) M—$Al_2O_3$ with M=lanthanides, (4) $Al_2O_3$ kneaded with M, where M is Bi & Sb compounded with periodic table Group VIB & VIIB metals, (5) M-modified H-ZSM-5 and H-ZSM-11 where M is Zn, Ga, Pt—Ga, Pt—Na, Mo, Cr, K, Ca, Mg, Al, and Group VIII metals, (6) M-modified MFI (H-GalloSilicates) where M is Si/Ga, Na/Ga, Al, (7) rare earth metal exchanged Y-zeolites or Ultra stable Y-zeolites, (8) Ti oxide paired with Zr oxide, (9) M plated onto aluminum, where M is Ni, and Ni, Cr, and Al alloys.

Pure dehydrogenations are endothermic by 15 to 35 kcal/g-mol. and hence have high heat requirements. The above catalysts are normally used at temperatures ranging from 300° C. to 600° C. depending on the residence time of the chemicals in the reactor. The effective temperature for some of these catalysts can be lowered by adding free radical initiators such as I, Br, $H_2O$, sulfur compounds or oxygen and their mixtures. However, special care should be taken to avoid reaction of desirable di-radicals with free radicals generated from these initiators. This can be achieved by providing large mean free paths for these reactants in the reactor, reducing residence time and the adjustment of wafer temperatures to avoid condensation of low mass free radicals.

b. Debromination and Desulfurization Catalysts

When Y is Br or $SO_2R$, catalysts can be found in Hertler et al., *J. Org. Chem.* 28: 2877 (1963), U.S. Pat. No. : 3,268,599 (1966), Show et al., *J. Appl. Polym. Sci.* 13:2325 (1969), Chow et al., *J. Org. Chem.* 35(1):20 (1970). These references are incorporated herein fully by reference. When H is Br, and copper is a catalyst, the pyrolytic temperatures can be decreased from 550° C. to 350° C. Other catalysts include Rh, Pt, and Pd.

2. Loss Of Catalyst Function

With time, catalysts may lose reactivity due to changing their oxidative state or coke formation. The life time of the catalysts can be increased at high operating temperatures or high partial pressure of hydrogen. If catalysts lose activity by coke accumulation, they can be regenerated by careful oxidation followed by reduction with hydrogen before being returned to service. [See: J. J. McKetta ed., *Encyclopedia of Chemical Processing and Designs:* Catalysis and Catalysts Vol. 6:420; Petroleum Processing, Catalyst Usage, Vol 35:89 Marcel Dekker, Inc. (1992), incorporated herein fully by reference.

B. Transport Polymerization Using Electromagnetic Radiation

In addition to equipment utilizing thermal methods for dissociating precursors, equipment utilizing electromagnetic radiation is useful for practicing this invention. Useful electromagnetic radiation is in the infrared (IR), ultraviolet (UV) and vacuum ultraviolet (VUV) spectra. UV and VUV produce no heat, whereas IR produces heat. When used in combination, IR and either UV or VUV can dissociate precursors with increased efficiency.

FIG. 4 is a schematic diagram of a transport polymerization system 400 using electromagnetic radiation as an energy source for cracking precursor molecules. Precursors are transported from the precursor tank 404 through a pipe 408 and through a mass flow controller 412 through another pipe 416 and into a tube 420 which is transparent to the types of electromagnetic radiation to be used. Electromagnetic radiation sources can be IR 424, UV 426, or VUV 428. For IR irradiation, a glass tube is sufficient. For UV irradiation, quartz tubes are necessary, and preferably are made of a single crystal quartz. For VUV irradiation, tubes made of $MgF_2$, LiF, or $CaF_2$ are necessary because the short wavelengths of VUV cannot pass easily through quartz.

After dissociating in tube 420, the reactive intermediates are transported into the deposition chamber 422 surrounded by a heater 436. The wall of the chamber is heated to decrease the deposition of molecules on the chamber wall. This heating can be accomplished by any conventional means, including, but not limited to resistive heating. After entering chamber 432, the flow of intermediates is adjusted by a movable flow pattern adjustor 440. Vertical movement of the flow pattern adjustor 440 adjusts the flow rate of intermediates into the chamber 432 and aids in mixing the intermediates more evenly within the chamber 432. Horizontal movement of flow pattern adjustor 440 adjusts the flow distribution of intermediates over the wafer 448. The flow pattern adjuster can be a flat, stainless steel plate, or alternatively can be a porous or honeycomb structure. A gas dispersion plate 444 evenly disperses the flow of intermediates over the wafer 448. Dispersion holes between the flow pattern adjuster and the wafer ensure the dispersion of the intermediates. The wafer 448 is held by a cold chuck 452, which is cooled by any chiller 456 employing any conventional means, including, but not limited to liquid nitrogen or reverse Peltier effect. A UV or VUV source also can be directed toward the wafer 448 to permit cross-linking of polymers after their deposition. A pipe 460 is for exhausting the chamber 452, and a pump 472 connected via a pipe 468 to a trap 464 maintain the pressure within the chamber at desired levels.

The cracker and deposition areas may be contained within the same chamber or in separate chambers which are connected together.

In another embodiment of the a cracking device 401 (FIG. 4a) of the invention, the electromagnetic energy 480 source is located at a site within the central area of flow 482 of precursors. The energy source is based in a housing 478, which is transparent to the wavelengths used. For IR irradiation, a glass tube is sufficient. For UV irradiation, quartz tubes are necessary, and preferably are made of a single crystal quartz. For VUV irradiation, tubes made of $MgF_2$, LiF, or $CaF_2$ are necessary because the short wavelengths of VUV cannot pass easily through quartz. The housing is inside the walls 476 of the cracking device. With this configuration, a large proportion of the electromagnetic energy is directed at the precursors as they flow past. This can increase the efficiency of precursor dissociation.

FIG. 4b depicts an alternative embodiment of a PATP system 402. Precursors 404 are volatilized in a carrier gas such as argon or nitrogen, pass through pipe 408 and through a mass flow controller 411. Alternatively, liquid precursors are injected via a liquid injector 412. After volatilization, precursors pass through another pipe 416 and into the chamber 432. The chamber 432 contains an electromagnetic energy source of IR 424, UV 426, and/or VUV 428 generators. The cracker 434 is within a wall 429 which is transparent to the wavelengths of electromagnetic radiation used. For IR irradiation, a glass tube is sufficient. For UV irradiation, quartz tubes are necessary, and preferably are made of a single crystal quartz. For VUV irradiation, tubes made of $MgF_2$, LiF, or $CaF_2$ are necessary because the short wavelengths of VUV cannot pass easily through quartz. The cracker 434 is surrounded laterally by a porous membrane 435, which permits dissociated precursors to exit the cracker 434. Porous membrane 435 has pores of from about 0.01 μm to about 10 μm in diameter. The membrane 435 is made from any material known in the art. The cracker 434 optionally contains a catalyst or free radical initiator (not shown). Flow of dissociated precursors is blocked by solid plate 437, and pass laterally (arrows) out of the cracker 434 and are directed through a powder (or dimer) filter 443 (arrows) which permits only dissociated precursors to pass into the portion of the chamber 432 in which deposition takes place.

A solid baffle 446 maintains the flow of dissociated precursors toward the wafer 448. A diffusion plate 444 distributes the flow of dissociated precursors evenly over the surface of a wafer 448 which is held by a chuck 452, which holds wafer 448 by either electrostatic or vacuum means. The chuck is cooled by a conventional cooling device 456. The chuck 452 is moveable in up to 3 dimensions to permit the adjustment of the flow pattern of intermediates onto the wafer 448. The pressure within the chamber is kept constant by a pump 472, which is attached to chamber 432 by a trap 464 which prevents deposition of materials on the pump surfaces.

The cracker and deposition areas may be contained within the same chamber or in separate chambers which are connected together.

FIG. 4c depicts another alternative embodiment of a photon assisted transport polymerization (PATP) system 403. Precursors 404 are volatilized in a carrier gas such as argon or nitrogen, pass through pipe 408 and through a mass flow controller 411. Alternatively, liquid precursors are injected via a liquid injector 412. After volatilization, precursors pass through another pipe 416 and into the chamber 432. The chamber 432 contains an electromagnetic energy source of IR 424, UV 426, and/or VUV 428 generators. The cracker 434 is within a pipe 430 which is transparent to the wavelengths of electromagnetic radiation used. For IR irradiation, a glass pipe 430 is sufficient. For UV irradiation, quartz tubes are necessary, and preferably are made of a single crystal quartz. For VUV irradiation, tubes made of $MgF_2$, LiF, or $CaF_2$ are necessary because the short wavelengths of VUV cannot pass easily through quartz. Pipe 430 can be made with pores of from about 3 Å to about 5 Å in diameter to permit hydrogen to escape the cracker laterally. The cracker 434 has an open end, which permits dissociated precursors to exit the cracker 434. The cracker 434 optionally contains a catalyst or free radical initiator (not shown). Flow of dissociated precursors is directed by a guide 447 toward the wafer 448. Guide 447 also prevents hydrogen from reaching the wafer 448. Precursors flow through (arrows) a diffusion plate 444, optionally with a powder filter (now shown) which distributes the flow of dissociated precursors evenly over the surface of a wafer 448 which is held by a chuck 452, which holds wafer 448 by either electrostatic or vacuum means. The chuck is cooled by a conventional cooling device 456. The chuck 452 is moveable in up to 3 dimensions to permit the adjustment of the flow pattern of intermediates onto the wafer 448. The pressure within the chamber is kept constant by a pump 472, which is attached to chamber 432 by a trap 464 which prevents deposition of materials on the pump surfaces.

The cracker and deposition areas may be contained within the same chamber or in separate chambers which are connected together. These above configurations can also be used for equipment using the other power source of this invention.

1. Transport Polymerization Using Ultraviolet and Vacuum Ultraviolet Radiation

In this invention, photolytic methods of generating radical intermediates are preferred (FIG. 4). Using the photolytic method, the above Reaction 6 can be very selective and efficient if appropriate photon sources are used. The photon sources can be provided by ultraviolet (UV) light generated by mercury vapor discharge or metal halide lamps.

Exemplary sources of UV radiation for transport polymerization can include (1) a mercury lamp that provides from 50 to 220 mW/cm$^2$ of UV ranging from 185 to 450 nm or (2) a metal halide lamp that provides from 40 to 160 mW/cm$^2$ of UV ranging from 256 nm to 450 nm. These UV sources provide photon energies ranging from 2 to 5 eV, which are sufficient for generating radical intermediates.

An alternative to conventional UV light is vacuum ultraviolet (VUV). [See Kogelschatz and Eliasson, "Microdischarge Properties in Dielectric-Barrier Discharges," *Proc. Symp. High-Pressure Low-Temperature Plasma Chemistry* (Hakone, Japan) Aug. 1–8 (1987), hereby incorporated fully by reference.]. Incoherent excimer radiation can provide a large number of UV and VUV wavelengths for photolytic processing of various chemicals. The preferred source is incoherent excimer radiation derived from dielectric barrier discharge. UV and VUV photons that are in the ranges of 3 to 5 eV are especially useful. These energy levels are comparable with the bonding energies of most chemical bonds, thus are very effective for initiating photochemical reactions (see Table 2).

TABLE 2

Bond Energies of Selected Bonds

| Chemical Bonds | Bonding Energies (eV) |
| --- | --- |
| φ-CH$_2$Br | 2.52 |
| φ-CH$_2$—OR | 3.52 |
| φ-CH$_2$—CH$_3$ | 3.30 |
| φ-CH$_2$—NH | 3.09 |
| φ-CH$_2$—F | 4.17 |
| φ-CH$_2$—SR | 3.20 |
| φ-CH$_2$—H | 3.83 |

Table 2 shows the bonding energies in electron volts (eV) corresponding to certain bonds of this invention. This data is from Streitwiesser et al., *Introduction to Organic Chemistry, Appendix II,* University of California Press, Berkeley, Calif. (1992), incorporated herein fully by reference.

However, the energies of mercury vapor or metal halide UV radiation are too small to be useful for rapid transport polymerization. The desired residence time within the cracking chamber, which is the time available for photolysis should be in the range of a few milliseconds to several hundred milliseconds. Therefore, VUV is the most desirable form of energy for photon assisted transport polymerization.

VUV or UV incoherent excimer sources can be provided by dielectric barrier or silent discharge using a variety of gas or gas mixtures according to methods known in the art. For example, VUV can be generated using KrBr, Ar$_2$, ArCl, ArBr, Xe$_2$ and F$_2$ gases. Xe emits at 172 nm, Kr at 222 nm, and XeCl emits at 308 nm. As can be seen from Table 2, nearly all of the chemical bonds of interest in polymer manufacture can be broken using photolytic methods. Because excimer radiation is selective for the energy of the specific bonds, excimer radiation from a second source or alternatively, a plasma source may be used simultaneously if it is desired to break other bonds at the same time. Such a combination of excimer sources and plasma sources are useful to break bonds of precursors for making cross-linked polymers. Because the leaving groups of these precursors can be different, it is desirable to break those bonds selectively to generate tri- and other multi-functional reactive intermediates.

Using photon-assisted processes of this invention, it is also possible to cross-link the novel polymers after their deposition. By directing the photons toward the surface of the polymer, the electromagnetic energy disrupts some of the C—F or C—H bonds, creating radicals which can bond with nearby polymer chains, resulting in a cross-linked film of polymers. This can be accomplished by exposing the wafer to UV or VUV for several seconds up to several minutes.

2. Transport Polymerization Using Infrared (IR) Radiation

Figure 5:
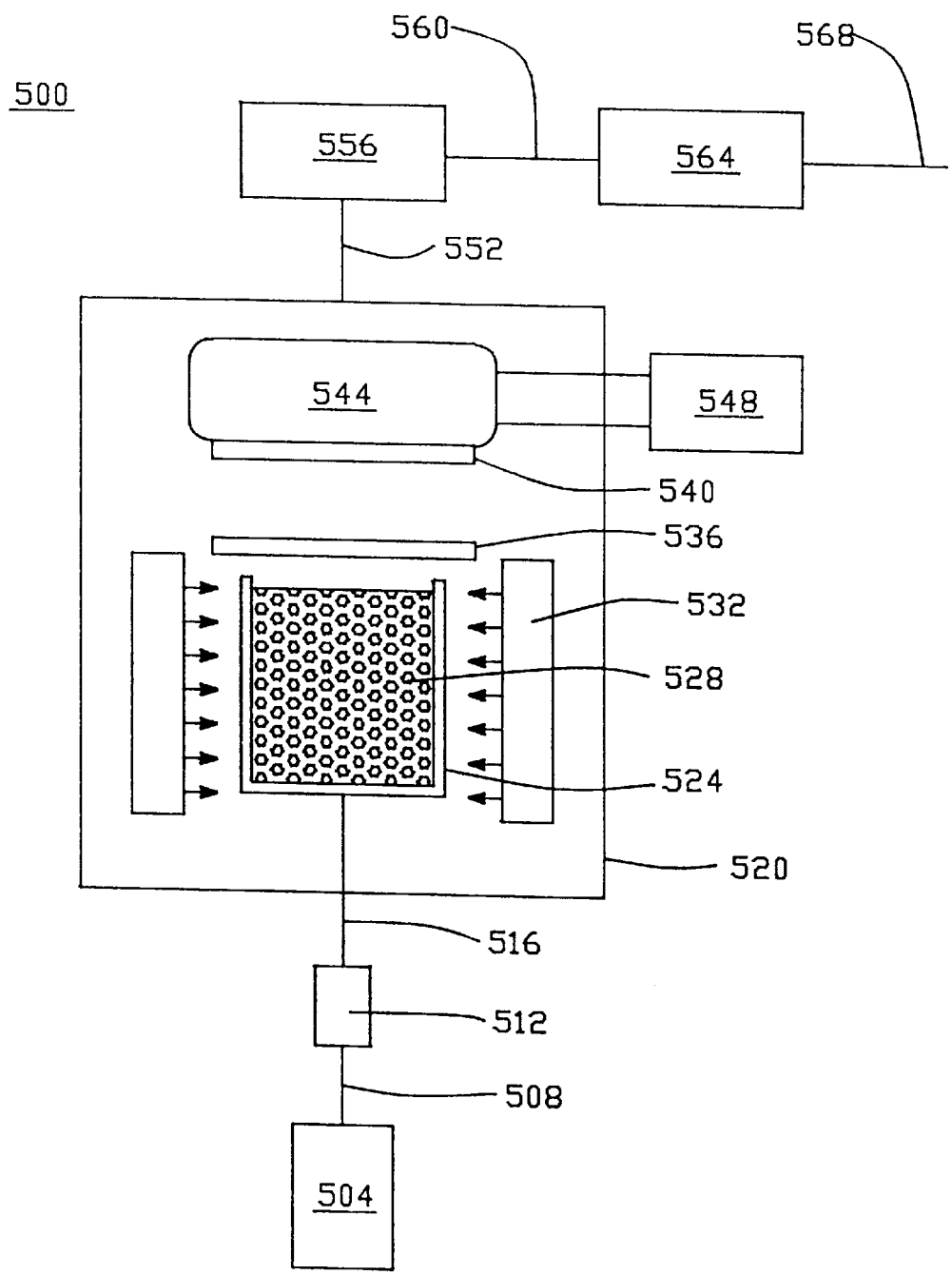
FIG. 5 depicts an embodiment of the invention used for transport polymerization using infrared (IR) radiation.

Transport polymerization equipment employing IR radiation 500 is shown in FIG. 5. The precursors are transported from a precursor holder 504 through a pipe 508 and through a mass flow controller 512 and a second pipe 516 into the chamber 520. The chamber contains a quartz chamber 524, optionally containing a catalyst 528. An infrared radiation source 532 is placed outside the quartz container 524, and the precursors are dissociated as they pass through the quartz container 524. A diffusion plate 536 can be moved in up to 3 dimensions to control the pattern of deposition and which can therefore optimize the flow pattern of intermediates to the wafer 540. Optionally, a flow pattern adjuster as shown in FIG. 4 (440) may be used to adjust the flow of intermediates over the wafer 540. The flow pattern adjuster can be moved in up to 3 dimensions. The wafer 540 is held on a cold chuck 544, which can be moved in up to 3 dimensions to control the pattern of deposition and which is cooled by a conventional chiller 548. The pressure in the chamber is maintained by a pump 564 connected via a pipe 560 to and a trap 556, which is connected to chamber 520 by a pipe 552. The trap 556 protect the pump from deposition of intermediates in the pump 564.

The cracker and deposition areas may be contained within the same chamber or in separate chambers which are connected together.

IR radiation is preferred over resistive heating because of higher ramp rate, lower cost, more uniform heating (See P. Singer, *Semiconductor International* March 1996: p 64; A. Dip, *Solid State Technology,* June 1996, page 113), incorporated herein fully by reference. In IR radiation, a combination of both thermolytic and photolytic reactions are expected. The IR power should be in the range of from 150 to 500 Watts, preferably from 300 to 400 Watts, and most preferably 350 Watts.

C. Plasma Enhanced Transport Polymerization

Plasma energy is also used to dissociate precursors into reactive intermediates. There are generally two types of energy sources for plasma enhanced transport polymerization or chemical vapor deposition. They are radiofrequency (RF) and microwave sources.

Plasma enhanced TP is carried out using the novel reactors described herein (FIGS. 6–9). With low density plasma, the electron density in the plasma is in the range of about $10^{12}$ to about $10^{13}$ electrons/cm$^3$. Low density plasma TP and CVD can be carried out at about 100 milliTorr to about 2 Torr. High density plasma (HDP) is characterized by electron densities in the range of about $10^{13}$ to about $10^{14}$ electrons/cm$^3$. High density plasma TP and CVD can be carried out at pressures of about 0.1 milliTorr to about 100 milliTorr. The higher electron density in HDP increases the formation of cross-linked polymers, because the higher energy density increases the numbers of tri-radical intermediates which can form cross-links between polymer chains.

Figure 6:
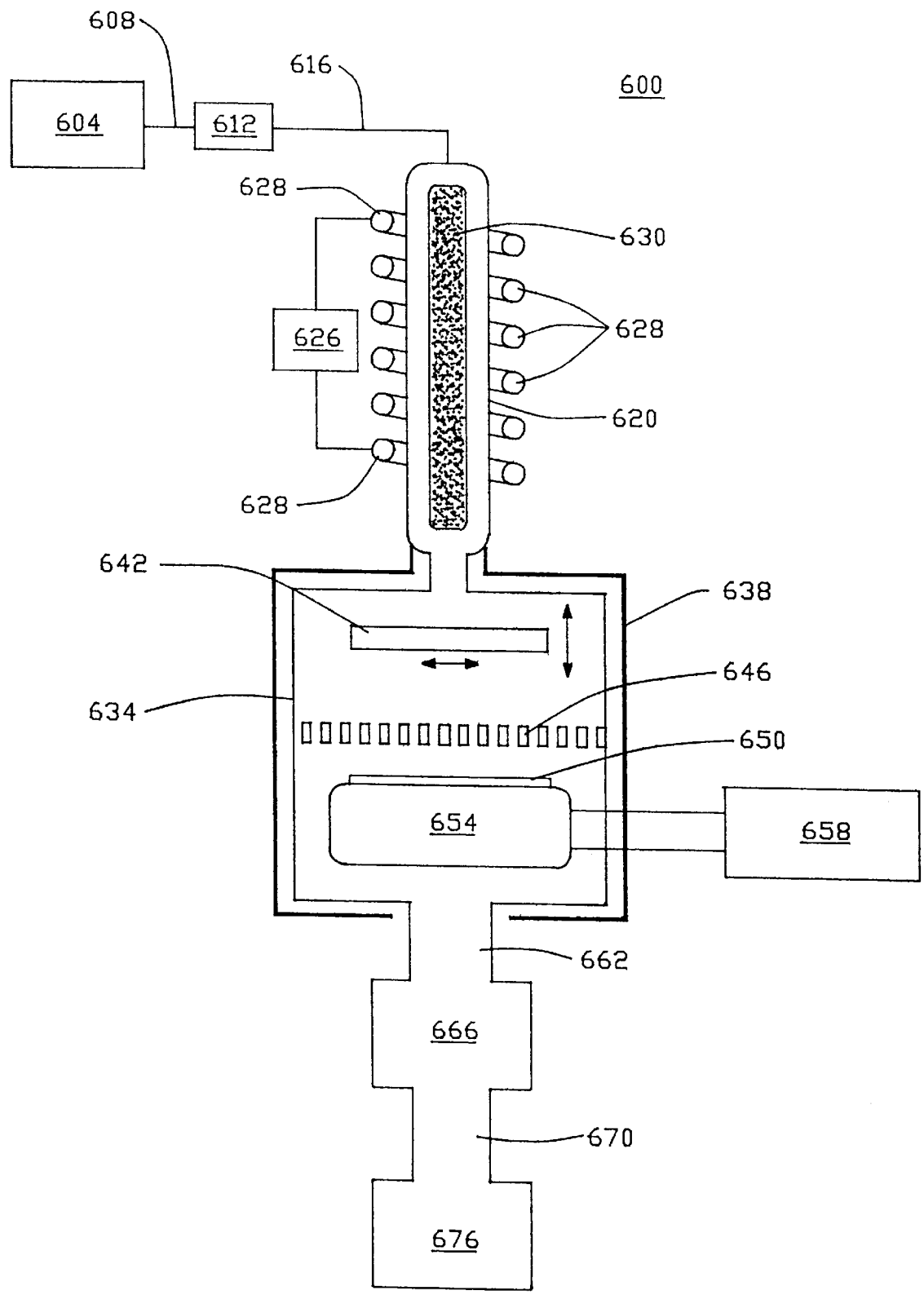
FIG. 6 depicts an embodiment of the invention used for radio frequency (RF) plasma enhanced transport polymerization (PETP) of polymers.

1. Plasma Enhanced Transport Polymerization Using a Radio Frequency Plasma Generator FIG. 6 is a schematic diagram of a transport polymerization system 600 employing RF to generate a plasma. The precursors are stored in a precursor holder 604, are transported via a pipe 608 and through a liquid injector for liquid precursors, or a mass flow controller 612 for gases, then are transported via another pipe 616 into a plasma tube 620 made of quartz. Preferably, the tube 616 is made of a single quartz crystal. Precursors are exposed to RF energy generated by a RF generator 626, through a coil 628, and a plasma 630 is thereby generated. The plasma 630 then flows into a deposition chamber 634 which is surrounded by a heater 638. The heater 638 keeps the walls of the chamber 634 above the condensation temperature of the reactive intermediates. This prevents condensation of intermediates onto the walls of the chamber 634. The flow of intermediates is adjusted by a flow pattern adjuster 642. In general, however, the flow pattern is moveable in up to 3 dimensions. Vertical movement of the flow pattern adjuster 642 adjusts the flow rate of intermediates into the chamber 634, and aids in mixing the intermediates in the chamber 634. Horizontal movement of the flow pattern adjuster 642 adjusts the distribution of the intermediates over the surface of wafer 650. A gas dispersion plate 646 with holes distributes the flow of intermediates evenly over the surface of the wafer 650. The gas dispersion plate 646 is also moveable in up to 3 dimensions.

The wafer 650 is held on a cold chuck 654, which can be moveable in up to 3 dimensions, is kept cool by a chiller 658 employing any conventional cooling method, including liquid nitrogen and reverse Peltier effect. The chamber is connected via a pipe 662 to a cold trap 666, which traps undeposited intermediates. The pressure in the chamber 634 is maintained by a pump 676 connected to trap 656 by a pipe 670.

The cracker and deposition areas may be contained within the same chamber or in separate chambers which are connected together.

Frequencies needed to generate plasmas are in a range of from 1 kHz to 2.5 GHz. A preferred range is between 400 kHz and 13.56 MHz, with the most preferred frequency being 13.56 MHz. The power should be in the range of 30 to 300 Watts. Preferred power range is 100 Watts to 250 Watts, and the most preferred power is 200 Watts of discharge power. The pressure should be kept within a range of from 0.001 Torr to 100 Torr, preferably from 50 milliTorr to 500 milliTorr, and most preferably at 100 milliTorr pressure. Alternatively, using low frequencies (5 kHz) can result in formation of insoluble poly(para-xylylene) which have higher temperature resistance. Morita et al. *Trans. IEEE Japan* pp: 65075 (1972). A carrier gas such as nitrogen or argon is used, and the flow rates of the carrier gas should be from 30 to 90 SCCM, preferably from 50 to 75 SCCM.

Figure 7:
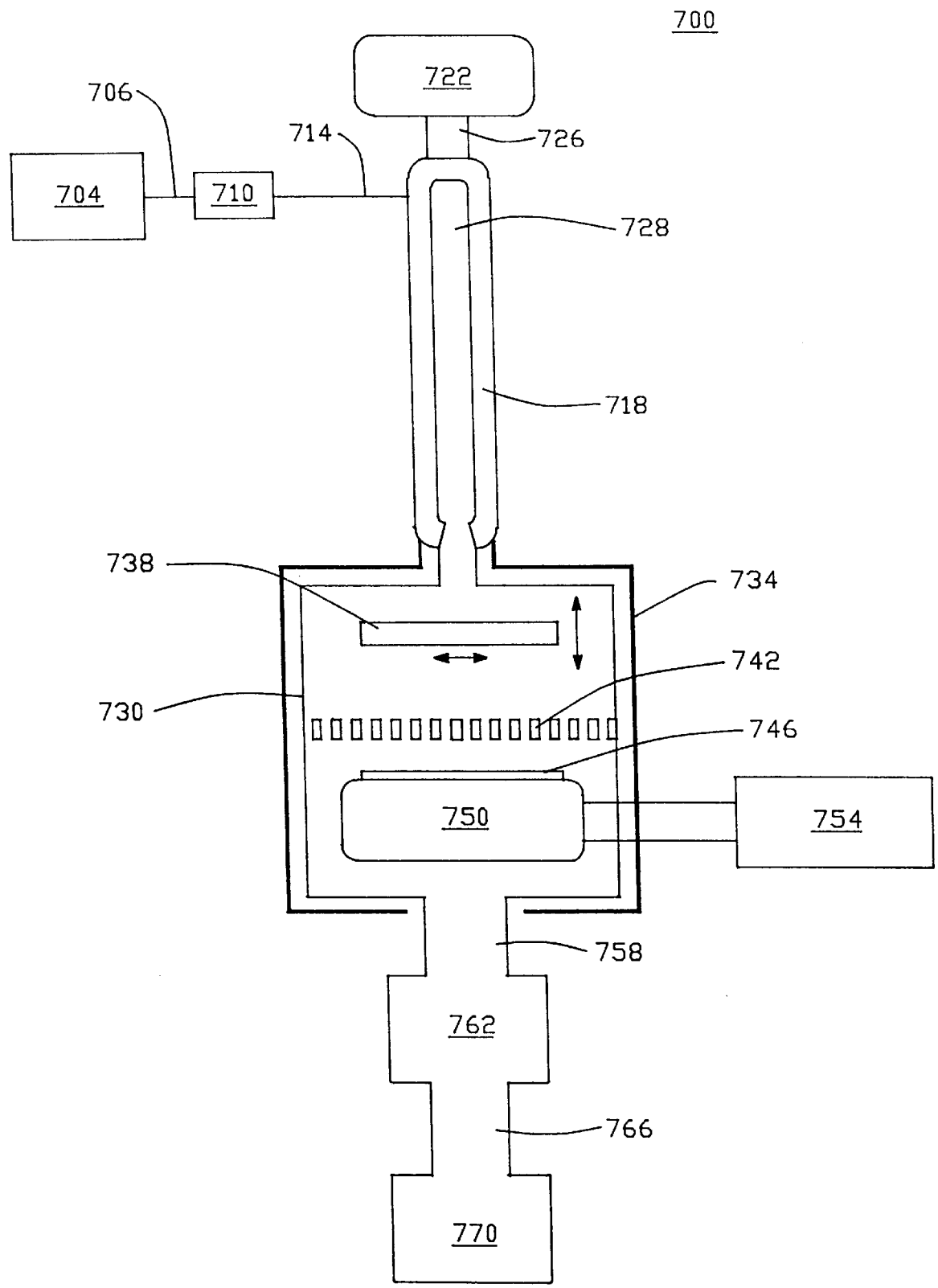
FIG. 7 depicts an embodiment of the invention for microwave plasma enhanced transport polymerization (PETP) of polymers.
Figure 8:
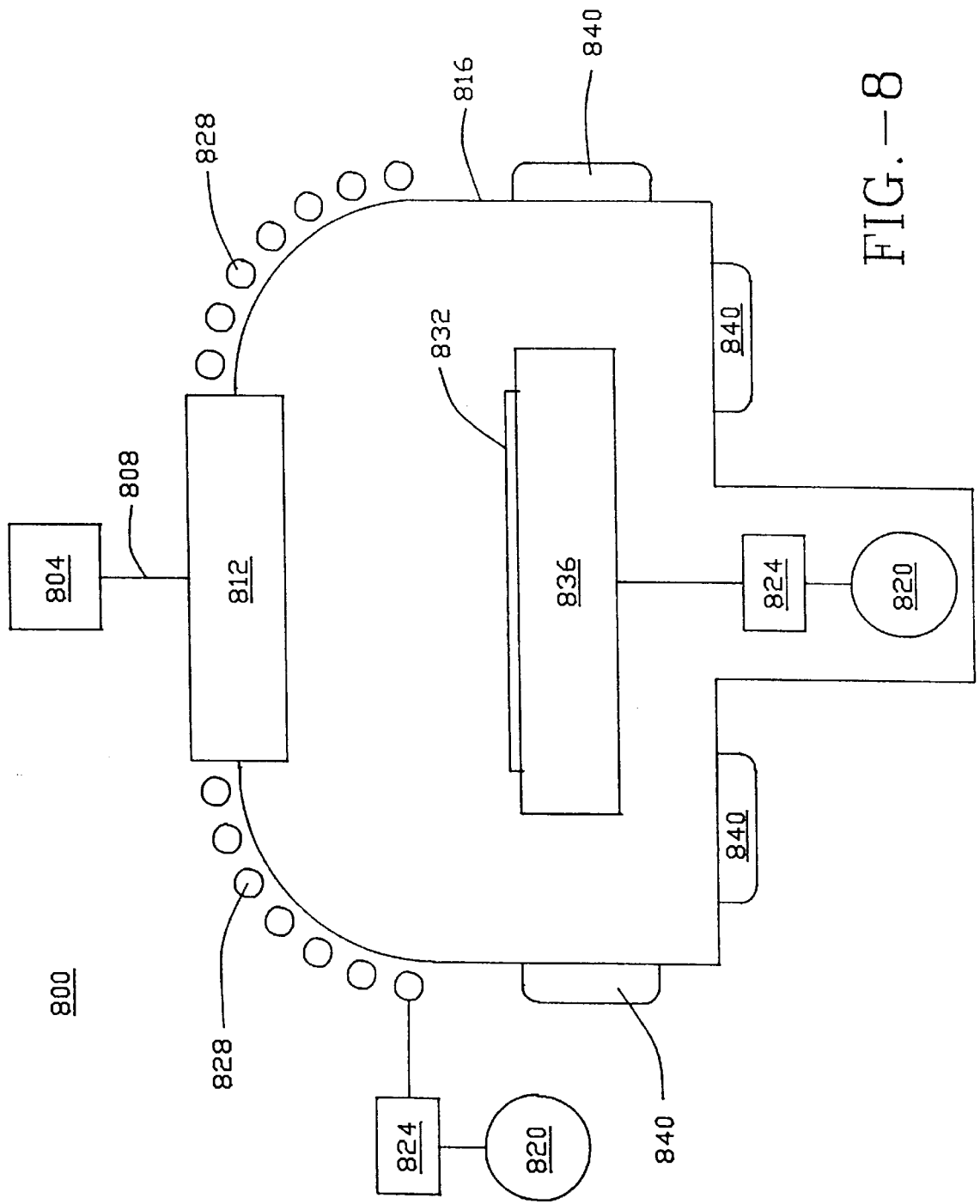
FIG. 8 depicts an embodiment of the invention for high density plasma enhanced transport polymerization of polymers.

2. Plasma Enhanced Transport Polymerization of Polymers Using a Microwave Generator Microwave sources can also be used to generate plasmas for generating the reactive intermediates. FIG. 7 is a schematic diagram of a transport polymerization system employing microwaves. Precursors are held in a precursor tank 704, and are vaporized, pass through a pipe 706 and through a mass flow controller 710, through a second pipe 714 and into a quartz tube 718. A microwave generator 722 is attached via a waveguide 726 to one end of the quartz tube 718. Microwave energy enters the quartz tube 718 where a plasma 728 is generated, which dissociates the precursors into reactive intermediates. After dissociation, the intermediates are transported into a chamber 730 heated by a heating device 734, including, but not limited to resistive heater. The flow of the intermediates is controlled by a flow pattern adjustor 738. The flow pattern adjuster can be moveable in up to 3 dimensions. Vertical movement of the a flow pattern adjustor 738 adjusts the flow rate of intermediates into chamber 630 and adjusts the mixing of intermediates in chamber 730. A gas dispersion plate 742, also moveable in up to 3 dimensions, evenly distributes the intermediates over the surface of wafer 746. The intermediates deposit on the wafer 746, which is held by a cold chuck 750, which can be moveable in up to 3 dimensions, is attached to a chiller 754 employing any conventional cooling means, including, but not limited to liquid nitrogen or reverse Peltier effect. The chamber pressure is controlled by a pump 770, connected via a pipe 766 to a cold trap 762. The trap 762 is connected via a pipe 758 to the chamber 730. The cold trap 762 protects the pump 770 from deposition of intermediates.

The cracker and deposition areas may be contained within the same chamber or in separate chambers which are connected together.

Microwave power density or electron field strength is selected based upon the residence time of the precursors in the chamber. The power is generally between about 200 and about 700 watts, preferably between about 400 watts and about 600 watts, and more preferably about 500 watts. Desirable electron energy is chosen to match the bond energy of the leaving group.

3. High Density Plasma Chemical Vapor Deposition

A high density plasma deposition process can also be used to dissociate precursors. In contrast to the low density plasma process described above, in high density plasmas, the electron density is in the range of from about $10^{13}$ to $10^{14}$ electrons/cm$^3$. This process must be carried at lower pressures than conventional plasma processes. In this embodiment, a inductively coupled high density plasma apparatus 800 is shown schematically in FIG. 8. A precursor delivery system 804 volatilizes or vaporizes the precursor, which flows through a pipe 808 and an anode gas injector 812 into the deposition chamber 816 which is made of material transparent to IR, UV, or VUV wavelengths. The anode gas injector 812 is attached to RF generators 820 which are matched by matching controllers 824. The output of the RF generators 820 passes through inductive coils 828 to produce an electrical field. The wafer 832 is held by a cathode electrostatic chuck 836, which is connected to the RF generator 820. IR, UV, or VUV sources 840 are used to decompose exhaust by-products. The exhaust gases from all the reactors disclosed herein can be treated similarly.

The cracker and deposition areas may be contained within the same chamber or in separate chambers which are connected together.

The plasma source power is in the range of about 1 Watt/cm$^2$ of wafer area to about 15 Watts/cm$^2$, preferably about 2 Watts/cm$^2$ to about 10 Watts/cm$^2$, and more preferably about 5 Watts/cm$^2$. The chamber pressure is maintained in the range of about 0.01 milliTorr to about 100 milliTorr, preferably from about 0.01 milliTorr to 10 milliTorr, and most preferably below about 5 milliTorr by a pump and cold trap (not shown). The wafer temperature is in the range from about 300° C. to 450° C., and is preferably about 350° C.

4. Combined Transport Polymerization and CVD Apparatus Utilizing Combined Photon and Plasma Processes FIG. 9 depicts a schematic diagram of a TP and CVD reactor 900 embodying the elements for photon-plasma and IR dissociation and deposition. Precursors 904 are stored in a precursor container 908 which is connected via a pipe 912 to a mass flow controller 916. For TP, precursors are transported into a dissociation reactor 924 which houses the dissociation chamber 928. The wall of reactor 924 is made of crystalline materials such as LiF, $MgF_2$, or $CaF_2$, which permits light of vacuum ultraviolet wavelengths to pass. Vacuum ultraviolet and ultraviolet light is generated by a silent discharge plasma generators 932, which are place inside infrared heaters 936. The infrared heaters 936 are placed inside DC magnets 940 and AC magnets 944. The magnets regulate the flow of plasma during dissociation, and the reactive intermediates so generated are transported to a deposition reactor 950.

The deposition reactor 950 contains a deposition chamber 960 containing a gas and reactant dispersion manifold 954, a gas and reactant dispersion plate 958. The walls of the deposition chamber are made of crystalline materials such as LiF, $MgF_2$, or $CaF_2$, which permits light of vacuum ultraviolet wavelengths to pass. The gas dispersion manifold 954 and the gas dispersion plate 958, are used to adjust the distribution and homogeneity of the intermediates. The intermediates are directed toward the wafer 962, which is held on a cold chuck 964. The gas dispersion manifold 954 and dispersion plate 958 are connected in parallel to a DC voltage bias anode 968, a DC voltage bias cathode 969, an AC voltage bias anode 970, and an AC voltage bias cathode 971. Silent discharge plasma generators 972 are placed outside the deposition chamber 960. Infrared heaters 974 are placed outside the silent plasma discharge generators 960 and DC magnets 978 and AC magnets 980 are placed outside the infrared heaters 974. Gases exit the deposition chamber 960 through a pipe 984, pass through a cold or reactive trap 988, pass through another pipe 992 to a vacuum pump 996. The pressure in the systems is maintained at a desired pressure using pump 996. The trap 988 protects the pump from deposition of intermediates.

For CVD, the deposition chamber 960 can be used without the dissociation reactor 924. Precursors are placed directly on wafer 962, and the chuck 964 is not cooled. IR, UV, or VUV radiation is directed toward the wafer 962. The radiation dissociates the precursor, and deposition of intermediates and polymerization takes place on the wafer.

Table 4 shows process conditions for combined photon-plasma assisted precursor dissociation using chamber 928, and Table 5 shows process conditions for combined photon-plasma precursor deposition in deposition chamber 960.

TABLE 4

Process Conditions for Photon-Plasma Precursor Dissociation

| Variable | Range | Preferred Range |
| --- | --- | --- |
| Temperature | 200° C.–600° C. | 350° C.–500° C. |
| Photon Wavelength | 100 nm–400 nm | 140 nm–300 nm |
| Photon Energy | 2.5 eV–12 eV | 4 eV–9 eV |
| Photon Flux | 10 milliW/cm$^2$–5 W/cm$^2$ | 40–100 milliW/cm$^2$ |
| Plasma Density | 10$^{12}$–10$^{14}$ electrons/cm$^3$ | 10$^{13}$ electrons/cm$^3$ |
| Pressure | 0.1 milliTorr–10 Torr | 1 milliTorr–100 milliTorr |

TABLE 5

Process Conditions for Photon-Plasma Precursor Deposition

| Variable | Range | Preferred Range |
| --- | --- | --- |
| Temperature | –20° C.–300° C. | –10° C. |
| Photon Wavelength | 100 nm–400 nm | 250 nm |
| Photon Energy | 2.5 eV–12 eV | 4.5 eV |
| Photon Flux | 10 milliW/cm$^2$–5 W/cm$^2$ | 10–100 milliW/cm$^2$ |
| Plasma Density | 10$^{12}$–10$^{14}$ electrons/cm$^3$ | 10$^{13}$ electrons/cm$^3$ |
| Pressure | 0.1 milliTorr–10 Torr | 1 milliTorr–100 milliTorr |

Table 6 shows process conditions used for chemical vapor deposition of the precursors of this invention

TABLE 6

Process Conditions for Photon-Plasma Precursor Chemical Vapor Deposition

| Variable | Range | Preferred Range |
| --- | --- | --- |
| DC Bias Voltage | 100–2000 V | 500 V |
| AC Bias Voltage | 10–200 V | 50 V |
| Pulsed Bias Voltage | 100–4000 V | 500 V |
| Pulse Width | 10–1000 msec | 1 msec |
| Pulse Frequency | 10 Hz–1000 Hz | 60 Hz |
| DC Magnetic Field Strength | 100–2000 Gauss | 700 Gauss |
| AC Magnetic Field Strength | 100–1000 Gauss | 500 Gauss |
| AC frequency | 10 Hz–500 Hz | 50 Hz–60 Hz |
| Pressure in Silent Discharge Generator | 100 Torr–1500 Torr | 760 Torr |
| AC Power to Silent Discharge Generator | 100 Watts–2000 Watts | 500 Watts |

The plasma density is reported as electron density, but it is to be noted that ion density must be the same to maintain charge neutrality of the plasma. Any non-uniformity of charge distribution can result in plasma damage to the thin film of low dielectric material, as well as imparting charge to the integrated circuit components.

Control of the plasma is by a magnetic field within the precursor chamber and in the deposition chamber 960. In the precursor reactor 924, the plasma is confined to any desired area, such as the center of the reactor 928. Additionally, alternating the polarity of the magnetic field stirs the plasma, ensuring even energy distribution within the plasma, thereby increasing the efficiency of dissociation of precursor molecules into reactive intermediates. In the deposition chamber, the magnetic field is used to control the pattern of distribution of intermediates over the wafer. This serves two purposes: (1) to direct the deposit of precursor to the desired portion of the surface, thus evening polymer deposition, and (2) minimizing film deposition on other parts of the reactor chamber, thus minimizing the required cleaning, minimizing particle generation, and simplifying the reactor chamber design.

Another feature comprises the placement of an electrical bias voltage within the deposition chamber. This provides a further means of controlling the flow of plasma-ionized species to the site of deposition on the wafer. A bias voltage, in the form of direct current (DC) or alternating current (AC) can be applied and modulated. Pulsed voltages can be used to alter the flow pattern of ions to either accelerate, decelerate, or to regulate the density of the plasma ions in the stream reaching the wafer. Optimization of ion velocity and flow, thus can be obtained using various combinations of magnetic field and bias voltage. Table 7 shows the ranges of the various magnetic field and bias voltage variables which are regulated in the dissociation portions of this invention.

TABLE 7

Optimization of Electrical and Magnetic Field Variables for Dissociation

| Variable | Range | Preferred Range |
| --- | --- | --- |
| Pressure in Silent Discharge Generator | 100 Torr–1500 Torr | 500 Torr |
| AC Power to Silent Discharge Generator | 100 Watts–2000 Watts | 500 Watts |
| AC Magnetic Field Strength | 100 Gauss–1000 Gauss | 500 Gauss |
| DC Magnetic Field Strength | 100 Gauss–2000 Gauss | 700 Gauss |

Table 8 shows process variables for the optimization of deposition of polymers of this invention.

TABLE 8

Optimization of Electrical and Magnetic Field Variables for Deposition

| Variable | Range | Preferred Range |
| --- | --- | --- |
| DC Bias Voltage | 100–2000 V | 500 V |
| AC Bias Voltage | 10–200 V | 50 V |
| Pulsed Bias Voltage | 100–4000 V | 500 V |
| Pulse Width | 10–1000 msec | 1 msec |
| Pulse Frequency | 10 Hz–1000 Hz | 60 Hz |
| DC Magnetic Field Strength | 100–2000 Gauss | 700 Gauss |
| AC Magnetic Field Strength | 100–1000 Gauss | 500 Gauss |
| AC frequency | 10 Hz–500 Hz | 50 Hz–60 Hz |

D. Cluster Tool For Multiple Depositions on Wafers

Several of the above processes can be carried out using a single piece of equipment. FIG. 10 shows a schematic diagram of a cluster tool 1000. A first station 1004 has a wafer cassette which holds one or more wafers for processing. A wafer is transported to a cleaning chamber 1008 where the wafer is exposed to VUV light of wavelengths in the range from about 120 nm to about 450 nm, or to UV light. This pre-treatment is to remove impurities from the wafer surface prior to deposition of material with low dielectric constant. After cleaning, the wafer is transported to a first processing station 1012, where a first deposition occurs. The processing station 1012 can be any of the devices depicted in FIGS. 3–9 above. After the first processing step at station 1012, the wafer is transported to a second processing station 1016, where further deposition of low dielectric material occurs. Subsequently, the wafer is transported to a third processing station 1020, where a third layer of low dielectric material is deposited. The wafer is transported to a fourth processing station 1024, where a fourth layer of low dielectric material is deposited. It is desirable to deposit several layers of low dielectric material in different processing stations because there are likely to be variations in the flow patterns in the different stations. Differences in flow patterns may result in the uneven deposition of films in each station. It is unlikely that the uneven deposition pattern for each station will be the same. Therefore, by depositing multiple layers of polymer, any differences in thickness of precursor resulting from deposition in one station can be at least partially corrected by polymer deposition in another station. The overall uniformity of the thickness is thereby improved.

Alternatively, the station 1024 can be used for post-deposition treatments, such as thermal annealing, reflow, plasma surface treatments, or cross-linking by exposing the polymer film to VUV of wavelengths in the range from 120 nm to 450 nm.

Another advantage of the cluster tool is the possibility of depositing different types of polymers at the different stations. Thus, it is possible to deposit a first layer chosen to adhere tightly to the substrate, a second layer chosen to have certain dielectric properties, thermal stability, or mechanical stability. A third layer may be chosen the have the same or different properties.

IV. Types of Polymers

The polymers resulting from the use of equipment of this invention includes cross-linked polymers made either by use of multi-functional precursors, which will spontaneously form cross-linked structures during their polymerization, by cross-linking the polymers after their deposition. Further, by using the equipment of this invention, it is possible to manufacture polymers of mixtures of different precursors, resulting in mixed polymers.

A. Formation of Cross-Linked Polymers Using Multi-Functional Precursors

To form cross-linked polymers using equipment of this invention, we describe three types of precursors.

1. Multiple Leaving Groups

The first type of precursors have the following general chemical structure:

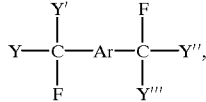

wherein Ar is a fluorinated aromatic moiety of at least 6 carbon atoms, wherein Y, Y', Y", and Y'" are leaving groups selected from the group consisting of —H, —SR, —NR$_3$, —SO$_2$R, —Cl, —Br, and —I, and wherein R groups are H, alkyl, or aromatic groups.

By selecting precursors with different Y, Y', Y", and Y'", and processing them to form reactive intermediates, multi-radical intermediates can be made. Cracking of these different C—Y, C—Y', C—Y", and C—Y'" bonds can be accomplished using combinations of excimer radiation or plasma, using devices such as those described in FIGS. 3–9. By selecting the wavelength of excimer radiation used, formation of radical intermediates can be tailored to the specific need. If additional C—Y bonds are to be broken, an additional energy source such as plasma can be used.

2. Multiple Spacer Groups with Leaving Groups

Another type of multi-functional compounds are also useful. To obtain amorphous thin films or thin films with a large proportion of amorphous phase, multi-functional compounds are used as precursors as shown below:

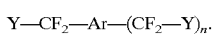

Y—CF$_2$—Ar—(CF$_2$—Y)$_n$.

In the above precursor, the Ar is an aromatic radical consisting of at least 6 and less than about 40 carbon atoms. The Y groups are selected from —SO$_2$R, —H, —Cl, —Br and —I, preferably, —H and —Br. The R is an alkyl group such as —CH$_3$ and n is an integer of at least 2 but no more than the allowable carbon numbers for sp$^2$C-x substitution in the Ar groups. Here, x is —H, —F or —CF$_2$Y. Compounds of this structure are prepared using Reaction 2 using a multi-functional aldehyde starting material.

When this compound is dissociated into reactive intermediates, the Y groups leave, resulting in the creation of a multi-functional intermediate molecule, which can polymerize into linear chains which cross-link with adjacent chains, thereby forming a 3-dimensional lattice network, herein termed a "super-lattice structure." For these multi-functional compounds, the aromatic moieties are not involved in the bonding. Thus, the aromatic moieties are free to rotate about their bonds, and this rotational freedom enables them to form more tightly packed configurations than molecules in which the aromatic moieties are more constrained. This precursor permits the addition of spacer moieties ($CF_2$) between the aromatic groups of adjacent polymer chains.

3. Multi-Functional Aromatic Moieties

In addition to di-functional aromatic moieties, multi-functional moieties are useful for forming cross-linked polymer networks. These moieties have general structural formulas as follows: ($—C_{10}H_{(5-n)}F_n—$), ($—C_6H_{(3-n)}F_n—$), ($—C_{13}H_{(6-n)}F_n—$), and ($—C_{14}H_{(7-n)}F_n—$). There are numerous positional isomers of each of these structural formulas, and each is considered to be part of this invention. Furthermore, multi-functional aromatic moieties with more than three functional groups are also considered part of this invention. These molecules, when cross-linked, tend to form large polymer sheets. The aromatic moieties are constrained by the covalent bonds linking them to other moieties of other polymer chains. Thus, these films will form strong polymer sheets. By depositing additional layers of polymer on top of each other, the $\pi$ electrons of the aromatic moieties can form $\pi$ bonds with adjacent polymer sheets, thus forming a very strong polymer matrix.

Upon deposition and polymerization of multi-functional radicals, cross-linked polymers are made. These cross-linked polymers have higher thermal stability, are stronger, and therefore have mechanical properties making them well suited for making integrated circuits of small feature size. Because they are made of fluorinated moieties, their dielectric constant is also low.

The degree of cross-linking can be varied by selecting desired leaving groups. The degree of cross-linking is also varied by selecting the appropriate ratios of precursors which form bi-functional radicals and precursors which form multi-functional radicals upon cracking. Increasing the proportion of multi-functional precursor increases the degree of cross-linking.

Moreover, the degree of cross-linking can be varied by varying the degree to which the precursors are cracked. An incompletely cracked multi-functional precursor will have fewer cross-linking bonds available than a fully cracked multi-functional precursor. Thus, the physical and electrical properties of polymer films can be adjusted to suit the particular need of the user.

An alternative way of manufacturing cross-linked polymers is to manufacture a thin layer of polymer on a wafer using bi-functional precursors and then to expose the wafer to light of an appropriate wavelength to photolyze selected C—Y bonds within the polymer. This permits cross-linking of polymers through bonding of adjacent reactive groups.

It is also possible to cross-link polymers after their deposition on wafer surfaces. These reactions are carried out by exposing the polymer to UV light for several seconds up to several minutes. Sharangpani and Singh, *DUMIC*: 117–120 (1997), incorporated herein fully by reference.

B. Manufacture of Thin Films Made From Combinations of Different Polymers

By varying the composition of different precursors, different polymer properties can be attained. For example, by combining di-functional precursors with multi-functional precursors, it is possible to manufacture polymers with properties different from those of either precursor alone. Because the multi-functional precursors can form cross-links with other polymers, the resulting thin film will have increased mechanical strength. By diluting the multi-functional precursor with di-functional precursor, the mechanical strength of the thin film can be tailored to suit the individual needs of the user.

Moreover, by varying the composition of precursors during the TP or CVD processes, it is possible to vary the composition of the polymer layer during its deposition. Thus, a user may deposit one type of polymer close to the substrate and change the composition of the polymer progressively, resulting in a different polymer at the surface of the dielectric layer. Such changes in polymer composition can be done step-wise by ceasing delivery of a first precursor and starting the delivery of a second precursor. Moreover, subsequent different layers of polymer may be deposited by changing to third and subsequent precursors. Furthermore, a gradient in polymer composition is achieved by gradually changing the relative proportions of different precursors during deposition.

V. Manufacture of Integrated Circuit Chips

The above precursors and methods are intended to provide polymers with low dielectric constants and high thermal stability for the manufacture of integrated circuits. FIG. 11 depicts a diagram of a multi-level integrated circuit chip 1100 embodying the features of this invention. The substrate 1104 is planarized prior to further processing. Then a source region 1108, a drain region 1112, and a polysilicon gate 1116 are manufactured on the substrate 1104. The wafer 1100 is inserted into a deposition chamber for TP or CVD, and a first Interlevel dielectric (ILD) layer 1120 of polymer or cross-linked polymer overlays the substrate 1104 and polysilicate gate 1116. A second polysilicon layer 1124 is overlaid by a second ILD layer 1128, a first metal line 1132 and an intermetal dielectric (IMD) layer 1136. On top of the IMD layer 1136, a second metal line 1140 and a second IMD layer 1144 is deposited. After each step of the deposition is completed, the wafer is planarized using chemical mechanical polishing or other method known in the art.

If desired, the polymer surface can be subjected to chemical mechanical planarization to create a smooth surface for further layers of polymer. A second layer of metal lines is deposited an defined on the surface, the wafer is inserted into a CVD chamber, wherein a second layer of polymer is deposited, again, filling the gaps between the metal lines. If desired, CMP may be performed to planarize the surface of the wafer.

VI. General Methods for Measuring Properties of Polymer Thin Films

The dielectric constant, K, is measured by fabricating a capacitor and measuring the capacitance over a range of frequencies. From the capacitor dimensions and film thickness, the K is then calculated using methods known in the art. Alternatively, the dielectric constant K of polymer thin films is determined by measuring the refractive index of the deposited film using methods known in the art. The K is then calculated as the square of the refractive index.

The glass transition temperature Tg can be determined from observing changes in heat capacity, modulus, or thermal expansion of a polymer specimen with changes in temperature. For example, Tg can be obtained by heating a polymer specimen in a differential scanning calorimeter (DSC) that measures the heat capacity of the polymer or by a thermal mechanical analyzer (TMA) that measures thermal expansion of the polymer as the temperature is increased. These methods are standard in the art and will not be discussed further.

The thermal stability is reflected by the decomposition temperature (TD) of a polymer. The Td is determined using a thermogravimetric analyzer (TGA). The wafer is progressively heated, and the weight loss of the sample is determined using a microbalance. This is commonly performed in a nitrogen atmosphere, to eliminate the possibility of oxidation of the polymer during heating. Published data such as the % weight loss and initial weight loss temperature, shows that Td depends not only on the temperature, but also upon the heating rate employed during measurements. This method is standard in the art and will not be discussed further.

Elastic modulus, E, and shear modulus, G, are obtained using well known ASTM methods, which will not be discussed further.

The residual stress on a polymer on a Si substrate, $\sigma^r$, can be assessed using a bending beam method (BBM) that monitors polymer/Si beam deflections resulting from mismatch of the coefficients of thermal expansion (CTE) of the polymer thin film and the Si substrate. Therefore, the deflections caused by a beam directed at a polymer/Si substrate sample relative to the deflections of a beam directed at a Si substrate prior to film deposition are recorded over various temperatures. From this information, the residual stress can be calculated using standard methods, which will not be discussed further.

Other embodiments of the invention are described in the Examples below.

EXAMPLE 1

Transport Polymerization Using a Resistive Heating Pyrolyzer

To form a polymer thin film on a wafer substrate, the wafer was first cleaned with UV light generated by a mercury vapor lamp (Dumax, 5000EL). The duration of the cleaning step was dependent upon the power used. At 20 mW/cm$^2$, 10 min was required, at 200 mW, one min was required, and at 400 mW/cm$^2$, 0.5 min was required. To decrease the time required, 400 mW/cm$^2$ is preferred.

The above precursor, $CF_2H$—$C_6H_4$—$CF_2H$ was cooled to temperatures ranging from about –5° C. to about 20° C., with preferred range of from about –5° C. to about 15° C. in a liquid sample holder. The precursor was then vaporized under a vacuum of about 1 to 10 milliTorr into a reactor via a needle valve or a mass flow controller to regulate its injection rates. The precursor, once introduced into the reactor (FIG. 3), was subjected to a pyrolytic temperature ranging from 740° C. to 780° C. The injection rate and pyrolysis of the precursor was conducted under a vacuum pressure ranging from 15 mTorr to several Torr.

Some of these thin films may also have many micro voids with pore sizes ranging from 10 Å to 50 Å. The resulting thin films had a reflective index of from 1.48 to 1.54 and dielectric constants ranging from 2.15 to 2.40 depending on the pyrolytic conditions. Higher temperatures result in higher cross-linking and higher dielectric constant. Their XPS spectra suggested the presence of C—F, indicative of cross-linking for thin films prepared under these pyrolytic conditions.

EXAMPLE 2

Transport Polymerization Using a Noble Metal Catalyst

The methods described above for Example 1 were repeated with the following changes: About 100 grams of catalyst pellets (1 wt % Pt on porous Alumina; Cat. Number 23211-4 was obtained from Aldrich Chemical Co., 1001 West Saint Paul Ave. Milwaukee, Wis. 53233. The catalyst was reduced under hydrogen before its use. The catalyst was loaded inside the pyrolyzer, which was heated to a temperature from about 400° C. to about 450° C. during deposition. The deposition was performed at a chamber pressure of about 60–90 milliTorr on a cold wafer at a temperature of about 0° C. for 60 minutes. The polymer film had a refractive index of about 1.523 and was 1000 Å in thickness.

EXAMPLE 3

Transport Polymerization Using a Transition Metal Oxide Catalyst

The methods described above for Example 2 were repeated with the following changes: 125 ml of dehydrogenation catalyst (Iron Oxide compound on porous Alumina, Cat. Number C-035 from Criterion Catalyst Company, 2 Greenpoint Plaza, Suite 1000, 16825 Northchase Drive, Houston, Tex. 77060) was used. The deposition was performed at a chamber pressure of about 260 to 280 milliTorr on a cold wafer at a temperature of about 0° C. for 60 minutes. The film had a refractive index of 1.513 and was about 1210 Å in thickness.

EXAMPLE 4

Transport Processing Using a BIS-Mercapto Precursor

A new precursor, a BIS-mercapto derivative of Br—$CF_2$—$C_6H_4$—$CF_2$—Br, or $C_2H_5S$—$CF_2$—$C_6H_4$—S—$CF_2$—$C_2H_5$ was used in the above Example 2. The BIS-mercapto compound was prepared from a dibromo derivative of the tetrafluoro precursor, Br—$CF_2$—$C_6H_4$—$CF_2$—Br, according to the method of Chow et al. (U.S. Pat. No. 3,274,267), incorporated herein fully by reference.

The precursor was heated to temperatures ranging from 25° C. to 50° C. in a solid sample holder. The precursor was then vaporized under a vacuum of about 1 to 10 milliTorr into a reactor via a needle valve and/or a mass flow controller to regulate its injection rates. The precursor, once introduced into the reactor, was subjected to a pyrolytic temperature ranging from 450° C. to 700° C. (FIG. 3). The injection rate and pyrolysis of the precursor was conducted under a vacuum pressure ranging from 15 mTorr to several Torr.

The pyrolytic temperatures are lowered to the range of from about 500° C. to about 650° C. when the BIS-mercapto derivative is used as precursor. From this precursor, more linear and crystalline polymers can be made. These resulting thin films have dielectric constants of from 2.2 to 2.3. From their XPS spectra, these thin films, in general, exhibit higher $CF_2$ contents than those obtained from Example 2.

EXAMPLE 5

Transport Polymerization Using a BIS-Amino Precursor

Another new precursor, a diamino derivative of $BrF_2C$—$C_6H_4$—$CF_2Br$, or $(CH_3)_3N^{+-CF}{}_2$—$C_6H_4$—$CF_2$—$N^{+(CH}{}_3)_3$ can also be used as a precursor for transport polymerization. The diamino compounds can be prepared from the dibromo derivatives according to Lee et al. (U.S. Pat. No. 4,849,559), incorporated herein fully by reference.

The precursor is heated to temperatures ranging from 25° C. to 60° C. in a solid sample holder. The precursor is then vaporized under a vacuum of about 1 to 10 milliTorr into a reactor via a needle valve or a mass flow controller to regulate its injection rates. The precursor, once introduced into the reactor (FIG. 3), is subjected to a pyrolytic temperature ranging from 740° C. to 780° C. The injection rate and pyrolysis of the precursor is conducted under a vacuum pressure ranging from 15 mTorr to several Torr.

The pyrolytic temperatures are lowered to the range of from about 450° C. to about 550° C. From this precursor, more linear and crystalline polymers can be made. These polymers have dielectric constants of from 2.2 to 2.3. From their XPS spectra, these thin films, in general exhibit higher $CF_2$ contents than those obtained from Example 2.

EXAMPLE 6

Transport Polymerization Using Vacuum Ultraviolet Light as a Di-Radical Generator The processes and chemicals described above can be used as described except for the substitution of the resistive pyrolyzer with a vacuum ultraviolet (VUV) generating source (FIG. 4). Such a source can generate VUV using, for example, the dielectric barrier discharge principle.

The silent discharge provides VUV in the range of 140 to 200 nm. Depending on the conditions and precursors, linear or highly cross-linked polymers with dielectric constants ranging from 1.99 to 2.34 can be prepared by using VUV radiation.

EXAMPLE 7

Transport Polymerization Using a Perfluorinated Precursor

A fully fluorinated precursor is manufactured by reacting a tetrafluorobenzene with $LiCH_2CH_2CH_2CH_3$ at −78° C. in tetrahydrofuran (THF) for 0.5 to 1 h. The resulting product is then further reacted with $CH_3CH_2CHO$ to generate $CHO—C_6F_4—CHO$. The resulting perfluoro-dialdehyde is then converted into the corresponding $CHF_2—C_6F_4—CHF_2$ using DAST.

The perfluorinated precursor is used as described above to yield polymer thin films. These films have dielectric constants of from 1.80 to 2.10. Films with higher dielectric constants are made by increasing the pyrolytic temperatures from 740° C. to 770° C., or by decreasing the VUV wavelength from 180 nm to 140 nm. These polymers are thermally stable up to 450° C. to 500° C.

These Examples are for illustrative purposes only, and are not intended to limit the scope of the invention. Rather, many variations of the above precursors, methods, polymers, films, and integrated circuit chips are within the scope of the invention, and are considered to be part of the invention. Other features, aspects and objects of the invention can be obtained from a review of the figures and the claims. All references cited herein are hereby incorporated fully by reference. It is to be understood that other embodiments of the invention can be developed and fall within the spirit and scope of the invention and claims.

It is to be understood that other theories may account for the operation of the invention and the invention does not rely upon any particular theory of operability.
Incorporation of Reference Each of the references cited above in this application is herein incorporated fully by reference.
Industrial Applicability This invention includes novel methods for making linear and cross-linked polymers made with the novel and known starting materials and precursors.

This invention also includes thin films and integrated circuits made using the novel precursors and methods.

What is claimed is:

1. A transport deposition system (reactor) for making thin films comprising a cracker that dissociates precursors, a deposition area, a chuck adapted to hold a wafer, said chuck located in said deposition area, and a moveable flow pattern adjuster located between the cracker and the chuck.

2. The transport deposition system of claim 1, wherein the moveable flow pattern adjuster is moveable in at least one of 3 dimensions.

3. The transport deposition system of claim 1, wherein the moveable flow pattern adjuster is moveable along the direction of flow from the cracker to the chuck.

4. The transport deposition system of claim 1, wherein the moveable flow pattern adjuster is moveable toward or away from at least one of the cracker and the chuck.

5. The transport deposition system of claim 1, wherein the moveable flow pattern adjuster is moveable in a direction perpendicular to the direction of flow from the cracker and the chuck.

6. The transport deposition system of claim 1, wherein the chuck has a wafer mounting surface and the cracker has an outlet port and wherein the moveable flow pattern adjuster is moveable in a direction across at least one of the wafer mounting surface and the cracker outlet port.

7. A transport deposition system for making thin films comprising a cracker that dissociates precursors, a deposition area, a chuck adapted to hold a wafer, said chuck located in said deposition area, and at least one of a moveable diffusion plate and a moveable flow pattern adjuster located between the cracker and the chuck.

8. The transport deposition system of claim 7, wherein at least one of the moveable diffusion plate and flow pattern adjuster is moveable in at least one of 3 dimensions.

9. The transport deposition system of claim 7, wherein at least one of the moveable diffusion plate and flow pattern adjuster is moveable along the direction of flow from the cracker to the chuck.

10. The transport deposition system of claim 7, wherein at least one of the moveable diffusion plate and flow pattern adjuster is moveable toward or away from at least one of the cracker and the chuck.

11. The transport deposition system of claim 7, wherein the diffusion plate or flow pattern adjuster is moveable in a direction perpendicular to the direction of flow from the cracker and the chuck.

12. The transport deposition system of claim 7, wherein the chuck has a wafer mounting surface and the cracker has an outlet port and wherein the diffusion plate is moveable in a direction across at least one of the wafer mounting surface and the cracker outlet port.

13. A transport deposition system for making thin films comprising a cracker that dissociates precursors, a deposition area, a chuck adapted to hold a wafer, said chuck located in said deposition area, and a flow pattern adjuster and a diffusion plate, wherein at least two of the chuck, flow pattern adjuster and diffusion plate are moveable.

14. A reaction chamber for transport polymerization comprising a non-metallic, transparent outer shell surrounding a cracker, a light source that provides radiant energy to the cracker to dissociate a precursor to generate a reactive intermediate, a hydrogen membrane, an inlet port for introducing precursors into the cracker, and an outlet port for removing product from the cracker.

15. The reaction chamber of claim 14, wherein the light source for providing radiant energy further comprises at least one of infrared radiation, ultraviolet radiation and vacuum ultraviolet radiation.

16. A reaction chamber for transport polymerization comprising a non-metallic, transparent outer shell surrounding a cracker, a light source that provides radiant energy to the cracker to dissociate precursors to generate reactive intermediates, an inlet port for introducing precursors into the cracker, a hydrogen membrane at least partially surrounding the cracker, and an outlet port for removing product from the cracker.

17. A reaction chamber for transport polymerization comprising an outer shell surrounding a cracker, an energy source that provides energy to the cracker to dissociate precursors to generate reactive intermediates, an inlet port for introducing precursors into the cracker, a moveable flow pattern adjuster and an outlet port for removing product from the cracker.

18. The reaction chamber of claim 17, wherein the energy source utilizes at least one of an RF source and a microwave source to provide energy to the cracker.

19. A reactor used for making fluorinated polymer thin films comprising:
   a source of precursor;
   a cracker that is adapted to process the precursor;
   a source of energy associated with the cracker to dissociate the precursor; wherein the source of energy includes one of infrared radiation, ultraviolet radiation, vacuum ultraviolet radiation, radio frequency generator, and a microwave generator,
   a hydrogen membrane, and
   a chuck adapted for supporting a wafer.

20. The reactor of claim 19, further comprising at least one of a flow pattern adjuster and a diffusion plate that controls the distribution of dissociated precursors onto the wafer.

21. A reaction chamber for transport polymerization comprising a non-metallic, transparent outer shell surrounding a cracker, a light source that provides incoherent excimer radiation to the cracker to dissociate precursors to generate reactive intermediates, an inlet port for introducing precursors into the cracker, and an outlet port for removing product from the cracker.

22. A reactor used for making fluorinated polymer thin films comprising:
   a source of precursor;
   a cracker that is adapted to process the precursor;
   a means for generating energy in one of the vacuum ultraviolet range and in the range from ultraviolet to infrared, which means is associated with the cracker;
   a moveable flow pattern adjuster; and
   a chuck adapted for supporting a wafer.

23. The reactor of claim 21, further comprising means for controlling the distribution of dissociated precursors onto the wafer.

24. The reactor of claim 22, wherein the cracker is confined within a quartz vessel, and the energy source is one of IR and UV.

25. The reactor of claim 24, wherein the quartz vessel comprises one of a fused quartz crystal and a single quartz crystal and the energy source is one of IR and UV.

26. A reactor used for making fluorinated polymer thin films comprising:
   a source of precursor;
   a cracker that is adapted to process the precursor; said cracker having a quartz wall and a heat shield positioned externally to the wall, and the reactor including a chamber wall surrounding a heat shield;
   a means for generating energy in one of the vacuum ultraviolet range and in the range from ultraviolet to infrared, which means is associated with the cracker; and
   a chuck adapted for supporting a wafer.

27. A reactor used for making fluorinated polymer thin films comprising:
   a source of precursor;
   a cracker that is adapted to process the precursor; said cracker having a wall being transparent to one of wavelengths of vacuum ultraviolet or wavelengths in the range of ultraviolet and wavelengths of infrared radiation;
   a heat shield positioned externally to the wall;
   a chamber wall surrounding the heat shield;
   a means for generating energy in one of the vacuum ultraviolet range and in the range from ultraviolet to infrared, which means is associated with the cracker; and
   a chuck adapted for supporting a wafer.

28. A transport deposition system (reactor) for making thin films comprising:
   a cracker that dissociates precursors, said cracker being confined within a vessel which is transparent to one of wavelengths of vacuum ultraviolet or wavelengths in the range of ultraviolet and infrared;
   a deposition area;
   a chuck adapted to hold a wafer said chuck located in said deposition area;
   and a moveable flow pattern adjuster located between the cracker and the chuck.

29. The reactor of claims 1, 14 or 22, wherein the cracker dissociates a precursor which is a source for generating aromatic fluorine containing radicals.

30. The reactor of claims 1, 14 or 22, wherein the cracker dissociates a precursor which is a source for generating aromatic fluorine containing bi-functional radicals.

31. The reactor of claims 1, 14 or 22, further comprising a means for cooling the chuck.

32. The reactor of claims 1, 14 or 22, wherein the cracker produces a bi-functional aromatic radical which polymerizes on the wafer.

33. The reactor of claims 1, 14 or 22, wherein the product of the cracker is polymerized on the wafer.

34. The reactor of claims 1, 14 or 22, further including an exhaust port leading to a vacuum pump, which exhaust port is associated with the chuck.

35. A transport deposition system (reactor) for making thin films comprising:
   a source of precursor;
   a cracker that dissociates precursors;
   a means for generating energy in one of the vacuum ultraviolet range and in the range from ultraviolet to infrared, which means is associated with the cracker and is enclosed within a transparent tube located inside the flow stream of precursor;
   a deposition area;
   a chuck adapted to hold a wafer, said chuck located in said deposition area, and
   a moveable flow pattern adjuster located between the cracker and the chuck.

36. The reactor of claims 1, 14 or 22, further comprising a dimer filter placed between the cracker and the chuck.

37. The reactor of claims 1, 14 or 22, further comprising a dimer filter placed between the cracker and the chuck, wherein the dimer filter has pores in the range of 0.01 μm to 1 μm.

38. The reactor of claims 1, 14 or 22, further comprising a powder filter placed between the cracker and the chuck.

39. The reactor of claims 1, 14 or 22, further comprising a powder filter placed between the cracker and the chuck, wherein the powder filter has pores in the range of 0.01 μm to 1 μm.

40. The reactor of claims 1, 14 or 22, further comprising a filter for removing re-associated intermediates.

41. The reactor of claims 1, 14 or 22, further comprising a conically shaped guide extending from the cracker toward the chuck.

42. A reactor for transport polymerization, comprising a cracker, a chuck, a moveable flow pattern adjuster and a dimer filter between the cracker and the chuck.

43. A reactor for transport polymerization, comprising a cracker, a chuck, a moveable flow pattern adjuster and a powder filter between the cracker and the chuck.

44. A reactor for transport polymerization, comprising a cracker, a chuck, a moveable flow pattern adjuster and a device for removing re-associated intermediates, located between the cracker and the chuck.

45. A reactor for transport polymerization, comprising a cracker, a chuck, a moveable flow pattern adjuster and a conical guide located between the cracker and the chuck.

46. The reactor of claim 45, wherein the conical guide extends from about the periphery of the cracker to about the periphery of the chuck.

47. The reactor of claim 45, wherein the conical guide extends from about the periphery of the cracker to about the periphery of the chuck to direct gases from the cracker around the chuck toward an exhaust source.

48. A reactor for transport polymerization, comprising a cracker, a hydrogen membrane at least partially surrounding the cracker, a chuck, and a guide located between the cracker and the chuck.

49. The reactor of claim 48, wherein the guide extends from about the periphery of the cracker to about the periphery of the chuck.

50. The reactor of claim 48, wherein the guide inhibits hydrogen from mixing with dissociated intermediates.

51. The reactor of claim 48, wherein the guide directs the hydrogen around the periphery of the chuck.

52. The reactor of claims 1, 14 or 22, wherein a wafer pre-cleaner is associated with the chuck.

53. A transport deposition system (reactor) for making thin films comprising:
a cracker that dissociates precursors;
a deposition area;
a chuck adapted to hold a wafer, said chuck located in said deposition area;
a wafer pre-cleaner includes a source of one of ultraviolet or vacuum ultraviolet energy; and
at least one of a moveable flow pattern adjuster located between the cracker and the chuck and a hydrogen membrane.

54. The reactor of claim 53, wherein the pre-cleaner includes a UV excimer laser.

55. The reactor of claim 53, wherein the pre-cleaner includes a source of incoherent excimer radiation.

56. The reactor of claims 1, 14 or 22, wherein the cracker contains a catalyst.

57. A transport deposition system (reactor) for making thin films comprising:

a cracker having a catalyst selected from the group consisting of a dehydrogenation catalyst, a reforming catalyst and an oxidative dehydration catalyst that dissociates precursors;
a deposition area;
a chuck adapted to hold a wafer, said chuck located in said deposition area; and
a moveable flow pattern adjuster located between the cracker and the chuck.

58. The reactor of claim 57, wherein the dehydrogenation catalyst is selected from the group consisting transition metal oxides and noble metals on acid supports.

59. The reactor of claim 57, wherein said catalyst is selected from the group consisting of noble metals or metal sulfide on active carbon.

60. The reactor of claim 57, wherein the catalyst is selected from the group consisting of $Ga_{13}$, $Cr_{12}$, $GaAl_{12}$ and $Al_{13}$ on PILCs.

61. The reactor of claim 57, wherein the catalyst comprises $M-Al_2O_3$ where M is a lanthanide.

62. The reactor of claim 57, wherein the catalyst comprises $Al_2O_3$ kneaded with Bi and Sb compounded with a metal selected from the group consisting of periodic table Group VIB & VIIB metals.

63. The reactor of claim 57, wherein the catalyst is selected from the group consisting of M-modified H-ZSM-5 and H-ZSM-11 where M is selected from the group consisting of Zn, Ga, Pt—Ga, Pt—Na, Mo, Cr, K, Ca, Mg, Al, and metals selected from periodic table Group VIII metals.

64. The reactor of claim 57, wherein the catalyst comprises M-modified MFI (H-GalloSilicates) where M is selected from the group consisting of Si/Ga, Na/Ga, and Al.

65. The reactor of claim 57, wherein the catalyst comprises a rare earth metal exchanged Y-zeolite.

66. The reactor of claim 57, wherein the catalyst comprises a rare earth metal exchanged ultra stable Y-zeolite.

67. The reactor of claim 57, wherein the catalyst comprises Ti oxide paired with Zr oxide.

68. The reactor of claim 57, wherein the catalyst comprises M plated onto aluminum, where M is selected from the group consisting of Ni, Cr, Ni/Cr, and Ni/Cr/Al alloys.

69. The reactor of claims 1 or 22, further comprising a hydrogen membrane.

70. The reactor of claims 1 or 22, further comprising a hydrogen membrane to permit separation of processed precursor from a by-product.

71. The hydrogen membrane of claim 69 wherein the hydrogen membrane contains pores with diameters between about 3 Å and about 5 Å.

72. The hydrogen membrane of claim 69 wherein the said hydrogen membrane comprises holes sufficiently small to permit by-products to pass through, but does not permit processed precursor molecules to pass through.

73. The reactor of claims 1, 14 or 22, wherein said precursor for the synthesis of fluorinated polymers comprises a compound with the structure:

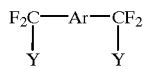

wherein Ar is a fluorinated aromatic moiety, and Y is a leaving group.

74. The reactor of claim 14, wherein said precursor for the synthesis of fluorinated polymers comprises a compound with the structure:

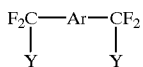

wherein Ar is a non fluorinated phenylene moiety, Y is a leaving group, and said reactor utilizes at least one infrared radiation and vacuum ultraviolet radiation.

75. The reactor of claims 1, 14 or 22, wherein the cracker includes a free-radical initiator.

76. A reactor for transport polymerization or chemical vapor deposition comprising:
- a chamber,
- a gas injector associated with the chamber,
- a chuck located in the chamber and spaced from the gas injector,
- an energy source located adjacent to the gas injector, and
- a radiation source associated with the chamber wall to decompose exhaust gases.

* * * * *